US010073159B2

(12) United States Patent
Kurokawa

(10) Patent No.: US 10,073,159 B2
(45) Date of Patent: Sep. 11, 2018

(54) MAGNETIC RESONANCE IMAGING APPARATUS AND FLIP ANGLE DETERMINATION METHOD

(75) Inventor: Shinji Kurokawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 532 days.

(21) Appl. No.: 14/116,421

(22) PCT Filed: May 23, 2012

(86) PCT No.: PCT/JP2012/063117
§ 371 (c)(1),
(2), (4) Date: Nov. 8, 2013

(87) PCT Pub. No.: WO2012/169349
PCT Pub. Date: Dec. 13, 2012

(65) Prior Publication Data
US 2014/0084918 A1      Mar. 27, 2014

(30) Foreign Application Priority Data

Jun. 9, 2011 (JP) .................................. 2011-129287

(51) Int. Cl.
*G01V 3/00* (2006.01)
*G01R 33/56* (2006.01)
(Continued)

(52) U.S. Cl.
CPC .......... *G01R 33/56* (2013.01); *G01R 33/543* (2013.01); *G01R 33/5617* (2013.01); *G01R 33/583* (2013.01)

(58) Field of Classification Search
CPC .. A61B 5/055; G01R 33/3415; G01R 33/543; G01R 33/36; G01R 33/5659
(Continued)

(56) References Cited

U.S. PATENT DOCUMENTS 4,972,148 A * 11/1990 Jensen ............... G01R 33/4835
324/307
6,268,728 B1 * 7/2001 Morrell ............... G01R 33/246
324/307
(Continued)

FOREIGN PATENT DOCUMENTS

CN       101014284 A    8/2007
JP       2011-156361    8/2011

OTHER PUBLICATIONS

European official action dated Jun. 1, 2016 in corresponding European Patent Application No. 12796794.1.
(Continued)

*Primary Examiner* — Walter L Lindsay, Jr.
*Assistant Examiner* — Frederick Wenderoth
(74) *Attorney, Agent, or Firm* — Cooper & Dunham LLP

(57) ABSTRACT

In order to maximize the SNR of an image in consideration of signal correction in a multi-echo sequence, flip angles of a plurality of refocus high frequency magnetic field pulses are determined in a multi-echo imaging sequence. Using an index that reflects the SNR of an image after signal correction of a plurality of acquired echo signals, a flip angle at which the SNR of the image becomes a maximum is determined by repeatedly calculating the index by changing information specifying the flip angle of each refocus RF pulse according to an optimization method set in advance.

20 Claims, 25 Drawing Sheets

(51) Int. Cl.
  *G01R 33/561* (2006.01)
  *G01R 33/58* (2006.01)
  *G01R 33/54* (2006.01)

(58) Field of Classification Search
  USPC .......................................................... 324/307
  See application file for complete search history.

(56) References Cited

U.S. PATENT DOCUMENTS

| | | | |
|---|---|---|---|
| 7,164,268 B2 * | 1/2007 | Mugler, III | G01R 33/5615 324/307 |
| 7,227,356 B1 | 6/2007 | Hariharan et al. | |
| 7,768,263 B2 | 8/2010 | Nagao et al. | |
| RE44,644 E * | 12/2013 | Mugler, III | 324/307 |
| 2003/0071620 A1 * | 4/2003 | Reiderman | G01R 33/4608 324/314 |
| 2007/0264200 A1 * | 11/2007 | Small | A61B 5/055 424/9.36 |
| 2008/0278163 A1 * | 11/2008 | Hancu | A61B 5/055 324/309 |
| 2008/0278759 A1 | 11/2008 | Noel | |
| 2008/0319301 A1 * | 12/2008 | Busse | A61B 5/055 600/410 |
| 2009/0190816 A1 * | 7/2009 | Yanasak | G01R 33/56341 382/131 |
| 2009/0251142 A1 * | 10/2009 | Taniguchi | G01R 33/5613 324/309 |
| 2010/0036235 A1 * | 2/2010 | Lamerichs | G01R 33/485 600/410 |
| 2011/0101979 A1 * | 5/2011 | Wiesinger | G01R 33/3621 324/309 |
| 2011/0181282 A1 | 7/2011 | Dannels | |

OTHER PUBLICATIONS

Feb. 28, 2015 Chinese official action in corresponding Chinese patent application No. 201280024917.4.
International Search Report in PCT/JP2012/063117.
Reed F. Busse, "Reduced RF Power Without Blurring: Correcting for Modulation of Refocusing Flip Angle in FSE Sequences", Magnetic Resonance in Medicine, Apr. 26, 2007, vol. 51, No. 5, 1031.
European search report dated Jun. 26, 2015 in corresponding European Patent Application No. 12796794.
J.P. Mugler et al., "Practical Implementation of Optimized Tissue-Specific Prescribed Signal Evolutions for Improved Turbo-Spin-Echo Imaging", Proceedings of the International Society for Magnetic Resonance in Medicine, Jul. 10, 2003, vol. 11, p. 203.
Reed F. Busse et al., "Fast Spin Echo Sequences With Very Long Echo Trains: Design of Variable Refocusing Flip Angle Schedules and Generation of Clinical T2 Contrast", Magnetic Resonance in Medicine, 2006.04.0, vol. 55, No. 5, pp. 1030-1032.
H. Lee et al., "SNR-Optimized Accelerated Phase-Sensitive Dual-Acquisition Signe-Slab 3D Turbo Spin Echo Imaging", Proceedings of the International Society for Magnetic Resonance in Medicine, Apr. 23, 2011, vol. 19, p. 386.
Juergen Hennig et al., "Calculation of flip angles for echo trains with predefined amplitudes with the extended phase graph (EPG)-algorith: Principles and applications to hyperecho and TRAPS sequences", Magnetic Resonance in Medicine, Jan. 1, 2003, vol. 51, No. 1, pp. 68-80.
Reed F. Busse et al., "Effects of Refocusing Flip Angle Modulation and View Ordering in 3D Fast Spin Echo", Magnetic Resonance in Medicine, Sep. 1, 2008, vol. 60, No. 3, pp. 640-649.
Hennig et al., "Multiecho Imaging Sequences With Low Refocusing Flip Angles", Journal of Magnetic Resonance, Jul. 1, 1988, vol. 78, No. 3, pp. 397-407.
Li Zhao et al., "Combined flip angle and echo scaling modulation for optimal fast spin echo", ISMRM2017 1325, Jun. 2017.

* cited by examiner

FIG. 5
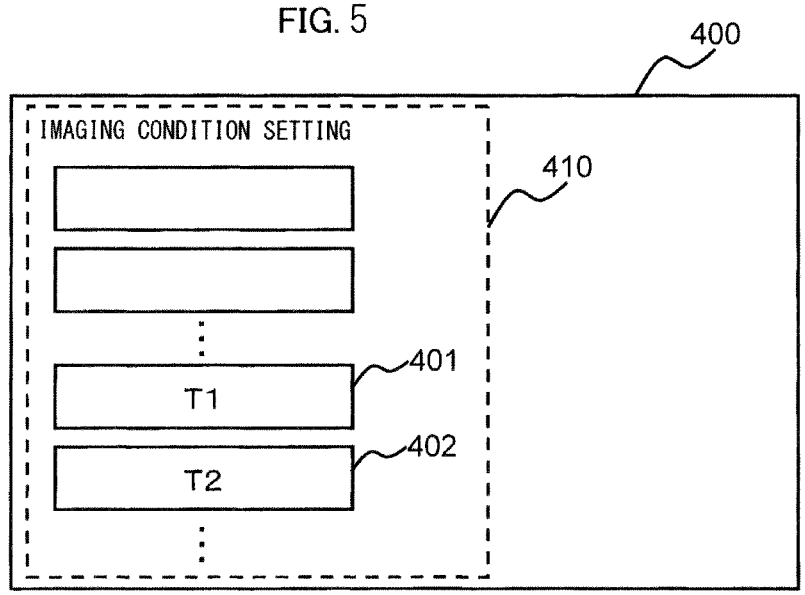
(a)
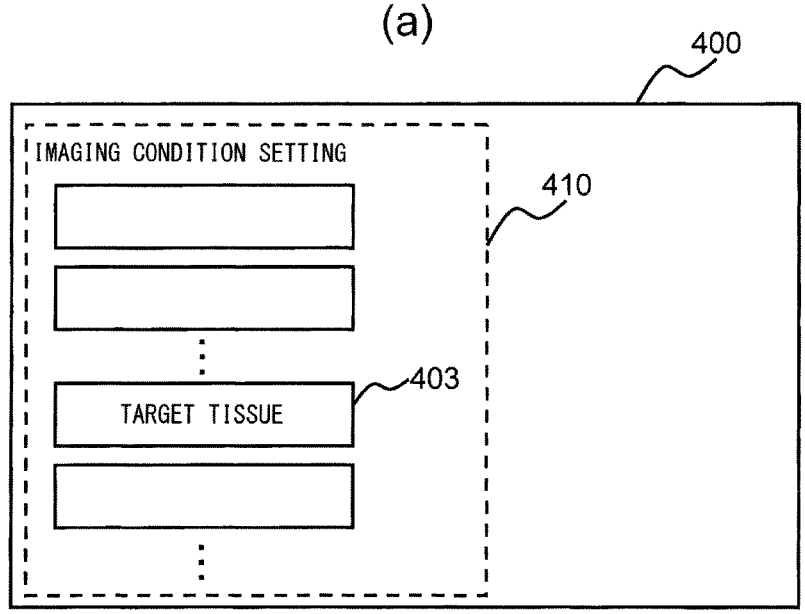
(b)

FIG. 7
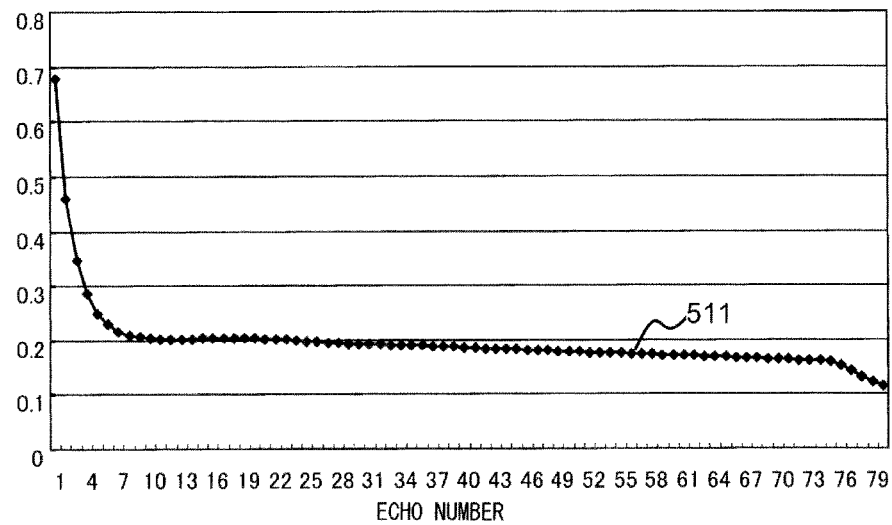
(a)
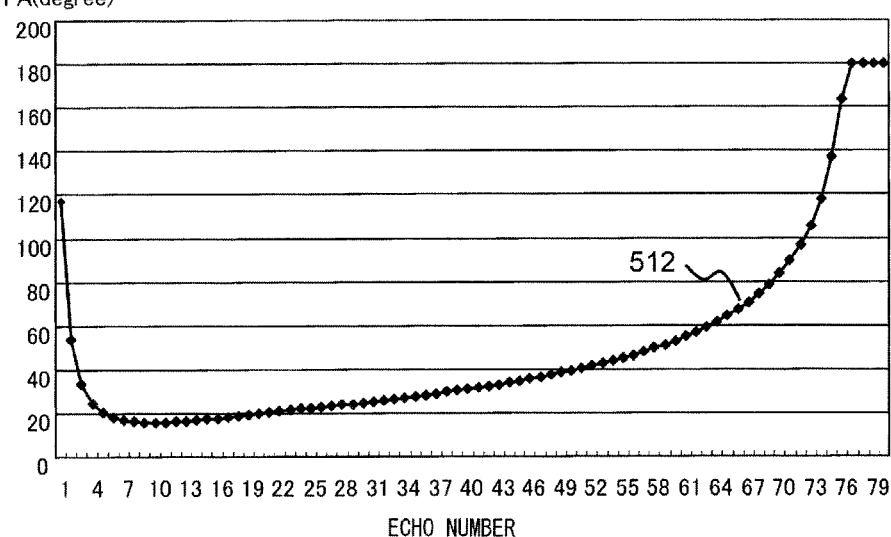
(b)

FIG. 8
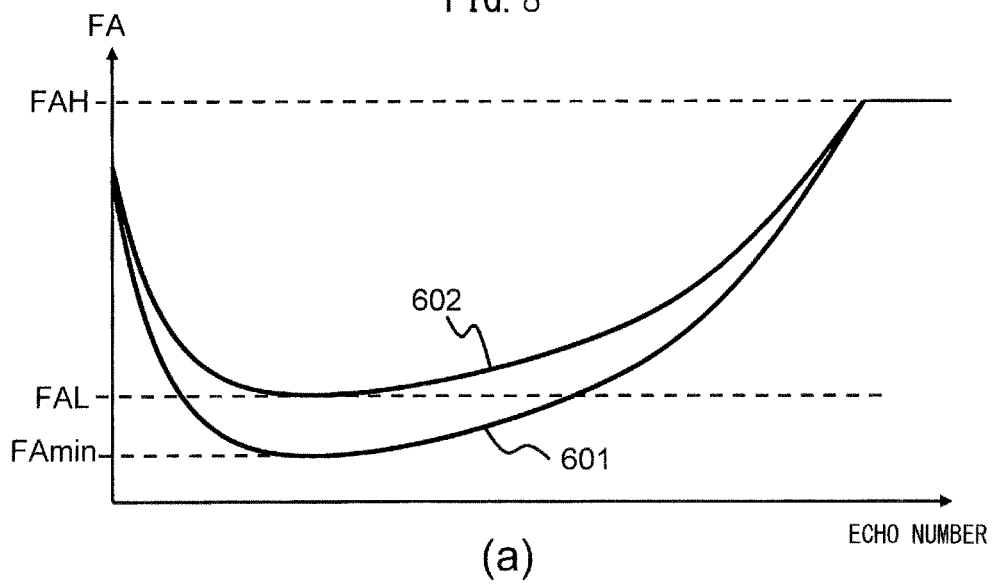
(a)
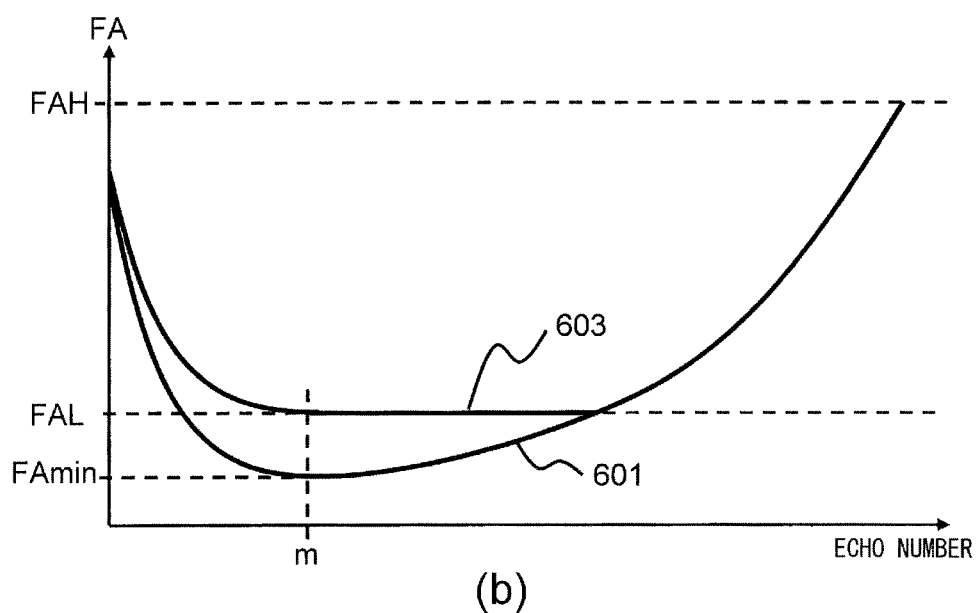
(b)

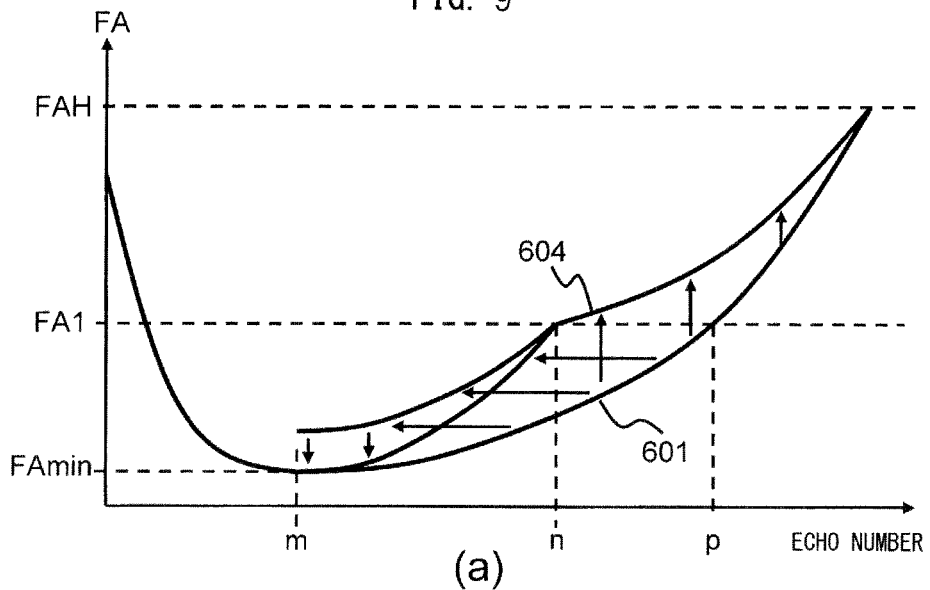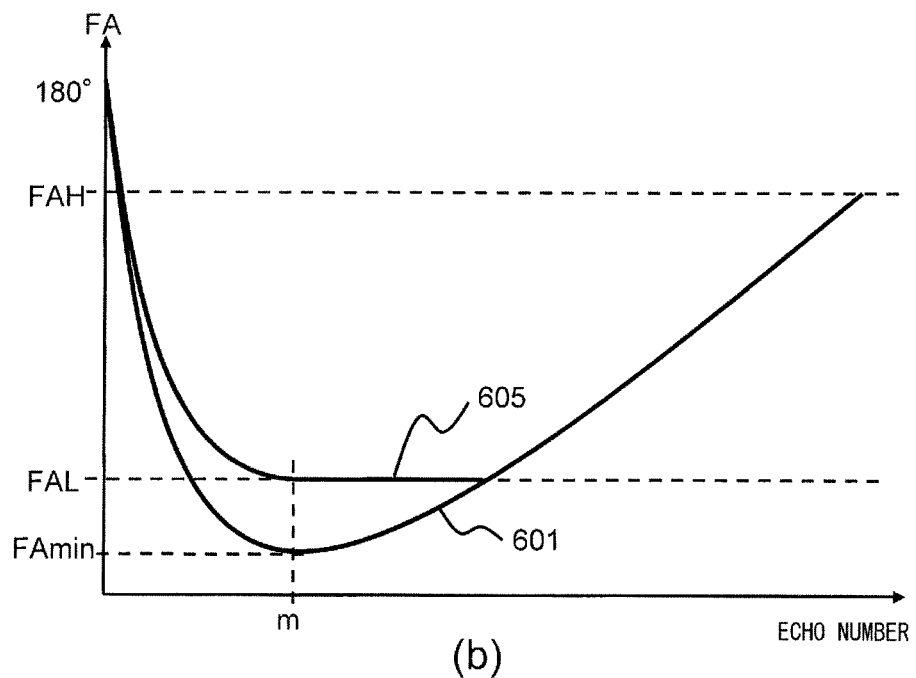
FIG. 9

FIG.17
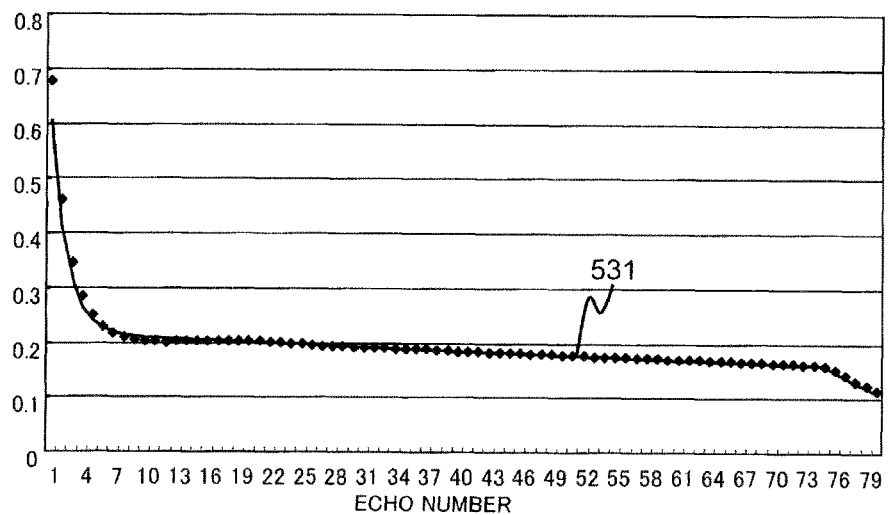
(a)
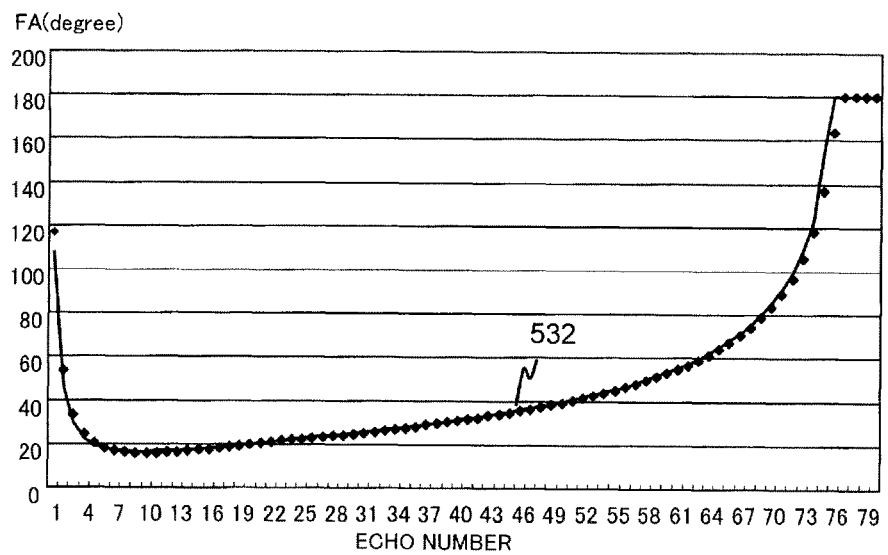
(b)

FIG. 24
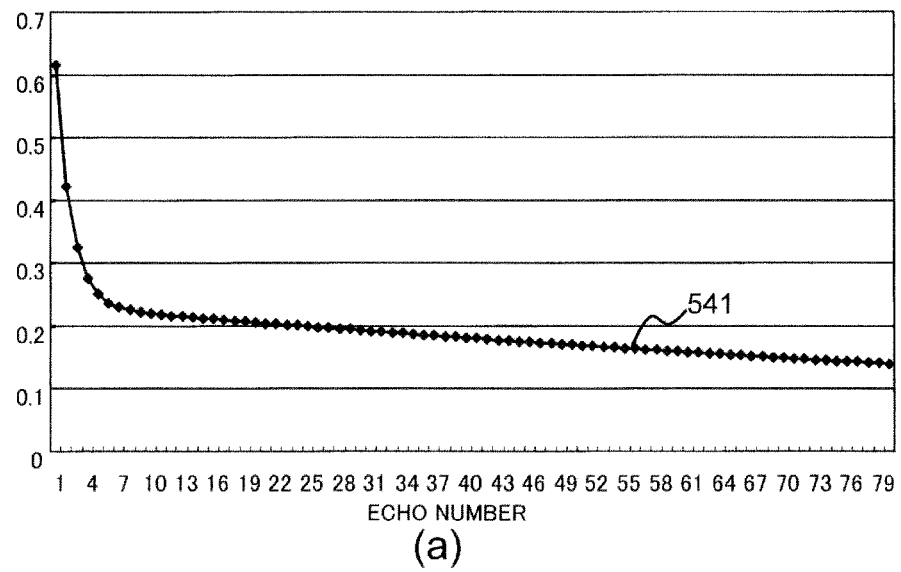
(a)
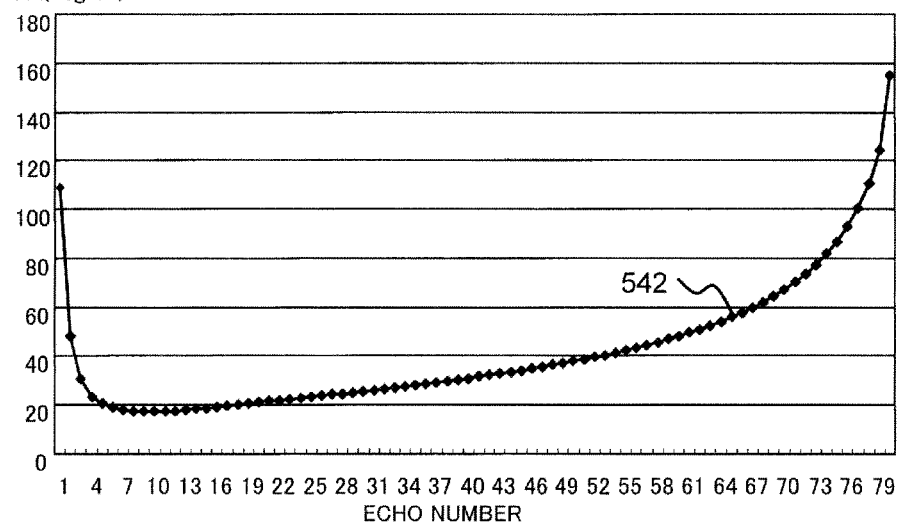
(b)

MAGNETIC RESONANCE IMAGING APPARATUS AND FLIP ANGLE DETERMINATION METHOD

TECHNICAL FIELD

The present invention relates to a nuclear magnetic resonance imaging (hereinafter, referred to as "MRI") technique for measuring a nuclear magnetic resonance (hereinafter, referred to as "NMR") signal from hydrogen, phosphor, or the like in an object and imaging nuclear density distribution, relaxation time distribution, or the like, and in particular, to an imaging technique that uses a variable refocus flip angle (VRFA) in multi-echo imaging.

BACKGROUND ART

The MRI apparatus is an apparatus that measures an NMR signal (echo signal) generated by an object, especially, the nuclear spins that form human tissue, and images the shapes or functions of the head, abdomen, limbs, and the like in a two-dimensional manner or in a three-dimensional manner. In the imaging, different phase encoding and different frequency encoding are given to NMR signals according to the gradient magnetic field, and the NMR signals are measured as time series data. The measured echo signals are reconstructed as an image by two-dimensional or three-dimensional Fourier transform.

Echo signals are measured according to the imaging sequence set in advance. There are a variety of imaging sequences. Among them, there is an imaging sequence that increases the speed of collecting echo signals by applying a refocus high frequency magnetic field (RF) pulse multiple times while changing the amount of phase encoding after applying an excitation high frequency magnetic field (RF) pulse once. Such an imaging is called multi-echo imaging, and a group of echo signals measured after each refocus RE pulse is called an echo train. In addition, the number of echo signals obtained after one RF pulse application is called an echo train length (ETL).

In multi-echo imaging, the flip angle (FA) of the refocus RF pulse may be changed. Such an imaging sequence is called a VRFA multi-echo sequence. In the VRFA multi-echo sequence, the FA of each refocus RF pulse is determined so as to achieve a predetermined purpose.

For example, there is a technique for determining the FA so that the resolution of an image is increased (for example, refer to PTL 1). In the technique disclosed in PTL 1, the FA is determined so that the signal strength of each echo signal in the echo train is constant. This is because signal attenuation is suppressed if the signal strength of each echo signal is constant and accordingly, there is no image blur (resolution is increased) even if the ETL is increased. Typically, the FA in PTL 1 steadily increases toward the final FA after becoming a small value (FAmin) once. Here, the FA at the center of k-space is defined as FAcenter, and the final FA is defined as FAmax.

In addition, in this specification, it is assumed that strength changes due to phase encoding and frequency encoding be neglected in the signal strength of the echo signal. In addition, the value of the signal strength is normalized with the virtual signal strength defined as 1 at the moment of excitation.

However, the image quality is determined not only by the resolution but also by various factors, such as the insensitivity to movement and the signal to noise ratio (SNR). In particular, the SNR is important in determining the image quality. Since the intention of the technique disclosed in PTL 1 is to make the signal strength constant, the SNR of the obtained image does not necessarily become the best. In addition, the method of determining the value to be made constant is arbitrary, and the image quality to be obtained at a certain value is not known.

In order to improve the SNR, there is a technique for determining the FA so that the signal strength of echo signals arranged at the center of k-space is increased (for example, refer to NPL 1). This is because echo signals arranged at the center of k-space generally determine the SNR. In NPL 1, FAmin, FAcenter, and FAmax are designated and then the FA is determined so that the signal changes steadily. This is because the insensitivity to movement in the image can be increased by increasing the FAmin and the SNR when signal correction is not taken into consideration can be improved by increasing the FAcenter.

In addition, there is a technique for determining the FA so that the signal strength of each data item is aligned when calculating images of two types of contrast by adding and subtracting (combining) two types of data, (for example, refer to NPL 2). In NPL 2, data whose balance of the signal strength of the brain parenchyma and CSF (cerebrospinal fluid) is different is acquired as the two types of data. Images of T2W and FLAIR are obtained by adding and subtracting these data items. In this case, the FA is determined so that the signal strength of the CSF of the two types of data is aligned in a region of the center of k-space. By aligning the signal strength when two types of data are acquired, weighting for aligning the signal strength at the time of addition and subtraction is not required. As a result, the SNR is improved.

In addition, an extended phase graph (EPG) is known as a method of calculating a change in the signal strength from the determined FA (for example, refer to NPL 3). In addition, conversely, a Prospective EPG is known as a method of calculating the FA from the change in the signal strength (for example, refer to NPL 4).

CITATION LIST

Non Patent Literature

[NPL 1] Reed F. Busse, Anja C. S. Brau, Anthony Vu, Charles R. Michelich, Ersin Bayram, Richard Kijowski, Scott B. Reeder, and Howard A. Rowley. "Effects of Refocusing Flip Angle Modulation and View Ordering in 3D Fast Spin Echo." Magnetic Resonance in Medicine 60:640 649 (2008)

[NPL 2] H. Lee, J-S. Seo, and J. Park. "SNR-Optimized Accelerated Phase-Sensitive Dual-Acquisition Single-Slab 3D Turbo Spin Echo Imaging" Proc. Intl. Soc. Mag. Reson. Med. 19:386 (2011)

[NPL 3] Juergen Hennig. "Multiecho Imaging Sequences with Low Refocusing Flip Angles" Journal of Magnetic Resonance 78:397 407 (1988)

[NPL 4] Juergen Hennig, Matthias Weigel, and Klaus Sheffler. "Calculation of Flip Anbgles for Echo Trains With Predefined Amplitudes With the Extended Phase Graph (EPG)-Algorithm: Principles and Applications to Hyperecho and TRAPS Sequences." Magnetic Resonance in Medicine 51:68 80 (2004)

SUMMARY OF INVENTION

Technical Problem

Generally, MRI, various signal corrections are performed for the purpose of improving the image quality and the like.

For example, in the multi-echo imaging, signal attenuation may be corrected (T2 correction) to suppress the image blur. If such signal correct on is performed, the amount of noise is increased according to the echo signal strength. In this case, the signal strength of all echo signals influences the SNR. Therefore, when signal correction is performed, the SNR cannot be sufficiently controlled in the method disclosed in NPL 1.

In addition, also in the technique disclosed in NPL 2, the SNR is not generally maximized in consideration of the signal strength of the entire echo train just by aligning the signal strength of CSF of two types of images in a region of the center of k-space. Therefore, when signal correction is performed, the SNR also cannot be controlled in the method disclosed in NPL 2.

The present invention has been made in view of the above-described situation, and it is an object of the present invention to provide a technique for maximizing the SNR in consideration of signal correction in a VRFA multi-echo sequence.

Solution to Problem

The present invention is intended to determine flip angles of a plurality of refocus high frequency magnetic field pulses in a multi-echo imaging sequence in a magnetic resonance imaging apparatus. Using an index that reflects an SNR of an image after signal correction of a plurality of acquired echo signals, a flip angle at which the SNR of the image becomes a maximum is determined by repeatedly calculating the index by changing information specifying the flip angle of each of the refocus RF pulses according to an optimization method set in advance.

For example, the FA of each refocus RE pulse of the VRFA multi-echo sequence is determined so that the SNR almost becomes a maximum by using an index that also reflects the signal strength of echo signals arranged in a region other than the center of k-space. The size of the SNR when changing the FA of each refocus RF pulse is determined not only by the signal strength of echo signals arranged at the center of k-space but also by the index that also reflects the signal strength of echo signals arranged in a region other than the center of k-space.

Advantageous Effects of Invention

According to the present invention, it is possible to maximize the SNR in consideration of signal correction in the VRFA multi-echo sequence.

BRIEF DESCRIPTION OF DRAWINGS

FIG. 5(a) is an explanatory view for explaining a UI screen of the first embodiment, and FIG. 5(b) is an explanatory view for explaining a modification of the UI screen of the first embodiment.

FIGS. 7(a) and 7(b) are graphs of a signal strength changing pattern and an FA changing pattern, respectively, obtained by the FA determination process of the first embodiment.

FIGS. 8(a) and 8(b) are explanatory views for explaining a modification process by an FA modification section of the first embodiment.

FIGS. 9(a) and 9(b) are explanatory views for explaining the modification process by the FA modification section of the first embodiment.

FIGS. 17(a) and 17(b) are graphs of a signal strength changing pattern and an FA changing pattern, respectively, obtained by the FA determination process of the third embodiment.

FIGS. 24(a) and 24(b) are graphs of a signal strength changing pattern and an FA changing pattern, respectively, obtained by the FA determination process of the fourth embodiment.

DESCRIPTION OF EMBODIMENTS

Figure 1:
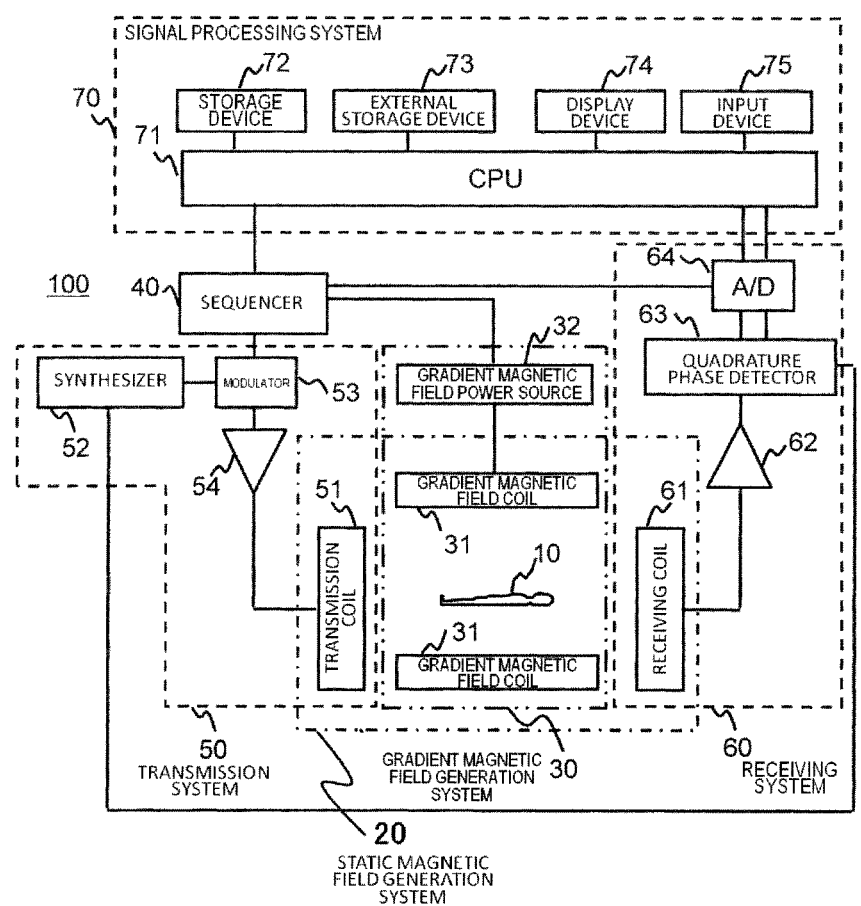
FIG. 1 is a block diagram of an MRI apparatus of a first embodiment.

The outline of the configuration for determining the flip angles of a plurality of refocus high frequency magnetic field pulses in the multi-echo imaging sequence of the present invention is as follows.

A magnetic resonance imaging apparatus includes: a static magnetic field generation system that generates a static magnetic field; a gradient magnetic field generation system that applies a gradient magnetic field to an object disposed in the static magnetic field; a high frequency magnetic field transmission system that transmits a high frequency magnetic field pulse to excite magnetization of the object at a predetermined flip angle; a signal receiving system that receives an echo signal generated by the object; and a control system that reconstructs an image from the echo signal received by the signal receiving system and controls operations of the gradient magnetic field generation system, the high frequency magnetic field transmission system, and the signal receiving system according to an imaging sequence. The control system includes a receiving unit that receives imaging conditions to determine the imaging sequence from a user and a sequence generation unit that generates the imaging sequence according to a pulse sequence and the imaging conditions received by the receiving unit. The pulse sequence is a sequence of applying a plurality of refocus high frequency magnetic field pulses after application of one excitation high frequency magnetic field pulse. The sequence generation unit determines a flip angle of each of the refocus high frequency magnetic field pulses on the basis of signal strength of a plurality of echo signals received by the signal receiving system so that an SNR of the image becomes a maximum.

In the magnetic resonance imaging apparatus described above, the sequence generation unit may determine the flip angle of each of the refocus high frequency magnetic field pulses to maximize the SNR of the image using an index that reflects an SNR of an image after signal correction of the plurality of echo signals.

In the magnetic resonance imaging apparatus described above, for example, the sequence generation unit may include a flip angle determination section that determines the flip angle of each of the refocus high frequency magnetic field pulses from the imaging conditions. The flip angle determination section may determine the flip angle by repeatedly calculating the index by changing information specifying the flip angle of each of the refocus RE pulses according to an optimization method set in advance.

In the magnetic resonance imaging apparatus described above, for example, the flip angle determination section may include a signal strength calculation section that calculates signal strength of each echo signal, which is obtained by application of a refocus high frequency magnetic field pulse corresponding to each information item, from the information specifying the flip angle of each of the refocus high frequency magnetic field pulses. A noise amplification factor, which is obtained from a square root of a mean of a square of a reciprocal of the calculated signal strength of each echo signal, may be used as the index. In addition, the flip angle of each of the refocus high frequency magnetic field pulses may be determined so as to minimize the noise amplification factor.

In the magnetic resonance imaging apparatus described above, for example, the information specifying the flip angle of each of the refocus high frequency magnetic field pulses may be a flip angle of each of the refocus high frequency magnetic field pulses.

In the magnetic resonance imaging apparatus described above, for example, the number of information items specifying the flip angle of each of the refocus high frequency magnetic field pulses may be smaller than the number of refocus high frequency magnetic field pulses.

In the magnetic resonance imaging apparatus described above, for example, the information specifying the flip angle of each of the refocus high frequency magnetic field pulses may be a series of intermediate values obtained by thinning out the flip angle of each of the refocus high frequency magnetic field pulses according to a predetermined rule. The flip angle determination section may include an intermediate value determination section that determines a series of intermediate values, which maximizes the SNR, by changing the series of intermediate values and a flip angle calculation section that calculates the flip angle of each of the refocus high frequency magnetic field pulses by interpolating the determined intermediate value.

In the magnetic resonance imaging apparatus described above, for example, the information specifying the flip angle of each of the refocus high frequency magnetic field pulses may be a parameter of a function showing a changing pattern in signal strength of an echo signal obtained by application of each of the refocus high frequency magnetic field pulses. The flip angle determination section may include a signal strength changing pattern determination section that determines the parameter to maximize the SNR by changing the parameter and determines a changing pattern in the signal strength and a flip angle calculation section that calculates the flip angle of each of the refocus high frequency magnetic field pulses from the changing pattern in the signal strength specified by the parameter.

In the magnetic resonance imaging apparatus described above, for example, the function may be a function that approaches an exponential function asymptotically, and the parameter may be at least one of a coefficient and a time constant of the exponential function.

In the magnetic resonance imaging apparatus described above, for example, the function may be a double exponential function, and the parameter may be one or more of a coefficient and a time constant of each of two exponential functions that form the double exponential function.

In the magnetic resonance imaging apparatus described above, the double exponential function may be a function that attenuates from the virtual signal strength at the moment when excited by the excitation high frequency magnetic field pulse.

In the magnetic resonance imaging apparatus described above, for example, a range for changing the flip angle may be set in advance, and the signal strength changing pattern determination section may change the parameter so that the flip angle falls within the range and is not saturated.

In the magnetic resonance imaging apparatus described above, for example, a noise amplification factor obtained from a square root of a mean of a square of a reciprocal of the calculated signal strength of each echo signal may be used as the index. The double exponential function may be configured to include a first exponential function, in which a changing pattern of the signal strength approaches asymptotically, and a second exponential function showing an asymptotic change. The parameter may be a time constant of the first exponential function. The signal strength changing pattern determination section may determine the time constant of the first exponential function, at which the flip angle of a final refocus high frequency magnetic field pulse becomes a minimum when changing the time constant of the first exponential function in a state where the noise amplification factor is fixed, as the parameter to maximize the SNR.

In the magnetic resonance imaging apparatus described above, for example, a range of the flip angle may be set in advance. The flip angle determination section may determine the flip angle according to a rule set in advance when the calculated flip angle is not present in the range.

In the magnetic resonance imaging apparatus described above, for example, the optimization method may be a searching method of narrowing the range of a solution.

In the magnetic resonance imaging apparatus described above, for example, the sequence generation unit may further include a flip angle modification section that modifies the flip angle determined by the flip angle determination section according to a rule set in advance.

In the magnetic resonance imaging apparatus described above, for example, the flip angle modification section may modify the flip angle so that some or all of the flip angles determined by the flip angle determination section fall within a range that is set in advance and can be set.

In the magnetic resonance imaging apparatus described above, for example, the flip angle modification section may modify the flip angle of the refocus high frequency magnetic field pulse set in advance to a value set in advance and then modify flip angles after the minimum flip angle, which is a flip angle other than the above flip angle, so as to change smoothly.

In the magnetic resonance imaging apparatus described above, for example, the flip angle modified to the value set in advance may be a flip angle to acquire echo signals arranged at the center of k-space.

In the magnetic resonance imaging apparatus described above, for example, a flip angle storage unit that stores a flip angle, which is determined so as to maximize the SNR of the image and which is the flip angle of each of the refocus high frequency magnetic field pulses, for each of the imaging conditions may be further included. The sequence generation unit may use a flip angle, which is stored in the flip angle storage unit so as to match the imaging conditions received by the receiving unit, as the above flip angle.

In the magnetic resonance imaging apparatus described above, for example, when a flip angle matched with the imaging conditions is not stored in the flip angle storage unit, the sequence generation unit may use a flip angle, which is stored so as to match the closest imaging conditions, as the flip angle.

In the magnetic resonance imaging apparatus described above, for example, when a flip angle matched with the imaging conditions is not stored in the flip angle storage unit, the sequence generation unit may use a flip angle, which is calculated by interpolating flip angles stored so as to match the close imaging conditions, as the flip angle.

In the magnetic resonance imaging apparatus described above, for example, information specifying longitudinal relaxation time and transverse relaxation time of nuclides to be imaged may be included in the imaging conditions.

In addition, a flip angle determination method for determining flip angles of a plurality of refocus high frequency magnetic field pulses in a multi-echo imaging sequence used in a magnetic resonance imaging apparatus includes: flip angle determination which determines, using an index that reflects an SNR of an image after signal correction of a plurality of echo signals acquired by the magnetic resonance imaging apparatus, a flip angle, at which the SNR of the image acquired by the magnetic resonance imaging apparatus becomes a maximum, by repeating calculating the index by changing information specifying the flip angle of each of the refocus RF pulses according to an optimization method set in advance.

Hereinafter, each embodiment will be described in detail.

First Embodiment

A first embodiment to which the present invention is applied will be described. Hereinafter, in all drawings illustrating the embodiments of the present invent on, the same reference numerals are given to elements having the same functions, and repeated explanation thereof will be omitted.

First, the outline of an MRI apparatus 100 of the present embodiment will be described on the basis of FIG. 1. FIG. 1 is a block diagram showing the overall configuration of the MRI apparatus 100 of the present embodiment. The MRI apparatus 100 of the present embodiment acquires a tomographic image of an object using an NMR phenomenon, and includes a static magnetic field generation system 20, a gradient magnetic field generation system 30, a sequencer 40, a high frequency magnetic field transmission system (transmission system) 50, a signal receiving system (receiving system) 60, and a control system (the sequencer 40 and a signal processing system 70).

The static magnetic field generation system 20 generates a uniform static magnetic field in a surrounding space of an object 10 in a direction perpendicular to the body axis in the case of a vertical magnetic field method and in the body axis direction in the case of a horizontal magnetic field method. A permanent magnet type, normal conduction type, or superconducting type static magnetic field generator (for example, a magnet) is disposed around the object 10.

The gradient magnetic field generation system 30 includes gradient magnetic field coils 31 wound in three axial directions of X, Y, and Z, which are the coordinate system (stationary coordinate system) of the MRI apparatus 100, and a gradient magnetic field power source 32 for driving each of the gradient magnetic field coils 31, and applies gradient magnetic fields Gx, Gy, and Gz in the three axial directions of X, Y, and Z by driving the gradient magnetic field power source 32 of each coil according to an instruction from the sequencer 40, which will be described later. At the time of imaging, a slice-direction gradient magnetic field pulse (Gs) is applied in a direction perpendicular to a slice surface (imaging cross-section) so that a slice surface is set for the object 10, and a phase-encoding-direction gradient magnetic field pulse (Gp) and a frequency-encoding-direction gradient magnetic field pulse (Gf) are applied in the two remaining directions, which are perpendicular to the slice surface and are also perpendicular to each other, so that the position information in each direction is encoded in the NMR signal (echo signal).

The sequencer 40 controls the gradient magnetic field generation system 30, the transmission system 50, and the receiving system 60 to apply a high frequency magnetic field pulse (hereinafter, referred to as an "RE pulse") and a gradient magnetic field pulse repeatedly according to the predetermined imaging sequence. The sequencer 40 operates according to a control signal from a CPU 71 provided in the signal processing system 70, which will be described later, and transmits various instructions, which are required for the data collection of a tomographic image of the object 10, to the gradient magnetic field generation system 30, the transmission system 50, and the receiving system 60.

The transmission system 50 emits an RF pulse to the object 10 in order to cause nuclear magnetic resonance in the nuclear spins of atoms that form the body tissue of the object 10, and includes a high frequency oscillator (synthesizer) 52, a modulator 53, a high frequency amplifier 54, and a transmission-side high frequency coil (transmission coil) 51. The high frequency pulse output from the synthesizer 52 is amplitude-modulated by the modulator 53 at a timing according to the instruction from the sequencer 40, and the amplitude-modulated high frequency pulse is amplified by the high frequency amplifier 54 and is supplied to the transmission coil 51 disposed adjacent to the object 10. As a result, an RE pulse is emitted to the object 10.

The receiving system 60 detects an echo signal (NMR signal) emitted by nuclear magnetic resonance of the nuclear spins of atoms, which form the body tissue of the object 10, and includes a receiving-side high frequency coil (receiving coil) 61, a signal amplifier 62, a quadrature phase detector 63, and an A/D converter 64. The echo signal of the response of the object 10 induced by the electromagnetic waves emitted from the transmission coil 51 is detected by the receiving coil 61 disposed adjacent to the object 10 and is amplified by the signal amplifier 62. Then, at a timing according to the instruction from the sequencer 40, the amplified signal is divided into signals of two systems perpendicular to each other by the quadrature phase detector 63, and each signal is converted into a digital amount by the A/D converter 64 and is transmitted to the signal processing system 70.

The signal processing system 70 performs various kinds of data processing, display and storage of processing results, and the like, and includes a CPU 71, a storage device 72, an external storage device 73, a display device 74, and an input device 75. For example, a tomographic image of the object 10 is reconstructed using the data from the receiving system 60. In addition, a control signal is transmitted to the sequencer 40 according to the imaging sequence. The reconstructed tomographic image is displayed on the display device 74 and is also recorded on the storage device 72 or the external storage device 73. The input device 75 is used when the operator inputs various kinds of control information of the MRI apparatus 100 or control information of processing performed in the signal processing system 70, and includes a track ball, a mouse, and a keyboard. This input device 75 is disposed adjacent to the display device 74, so that the operator controls various kinds of processing of the MRI apparatus 100 interactively through the input device 75 while viewing the display device 74.

In addition, in FIG. 1, the transmission coil 51 and the gradient magnetic field coil 31 are provided in the static magnetic field space of the static magnetic field generation system 20, in which the object 10 is inserted, so as to face the object 10 in the case of a vertical magnetic field method and so as to surround the object 10 in the case of a horizontal magnetic field method. In addition, the receiving coil 61 is provided so as to face or surround the object 10.

Currently, nuclides imaged by an MRI apparatus, which are widely used clinically, are a hydrogen nucleus (proton) that is a main component material of the object. The shapes or functions of the head, abdomen, limbs, and the like of the human body are imaged ins two-dimensional or three-dimensional manner by imaging the information regarding the spatial distribution of the proton density or the spatial distribution of the relaxation time of the excited state.

The imaging sequence by which the CPU 71 of the signal processing system 70 gives a control signal to the sequencer 40 is determined by a pulse sequence, by which the application timing of the RF pulse and the gradient magnetic field pulse is determined, and a parameter specifying the application strength, application timing, and the like of the RF pulse and the gradient magnetic field pulse. The pulse sequence is set in advance, and is stored in the storage device 72. In addition, the parameter is calculated in the signal processing system 70 on the basis of the imaging conditions set by the operator through the input device 75.

The signal processing system 70 of the present embodiment includes a sequence creation unit that creates an imaging sequence, which is used in the imaging, from the pulse sequence stored in advance and the parameter input by the operator. The sequence creation unit is realized when the CPU 71 loads a program stored in advance in the storage device 72 or the external storage device 73 to the memory and executes it.

Prior to the detailed explanation of the sequence creation unit of the present embodiment, the above pulse sequence used in the present embodiment will be described. In the present embodiment, a pulse sequence for multi-echo imaging, such as a fast spin echo (FSE), is used as the pulse sequence. Hereinafter, a case where the FSE is used will be described as an example in the present embodiment. In addition, the pulse sequence used in the present embodiment is not limited to the FSE, and it is also possible to use a pulse sequence in which a plurality of refocus RF pulses are applied within the repetition time TR after excitation pulse (90° pulse).

Figure 2:
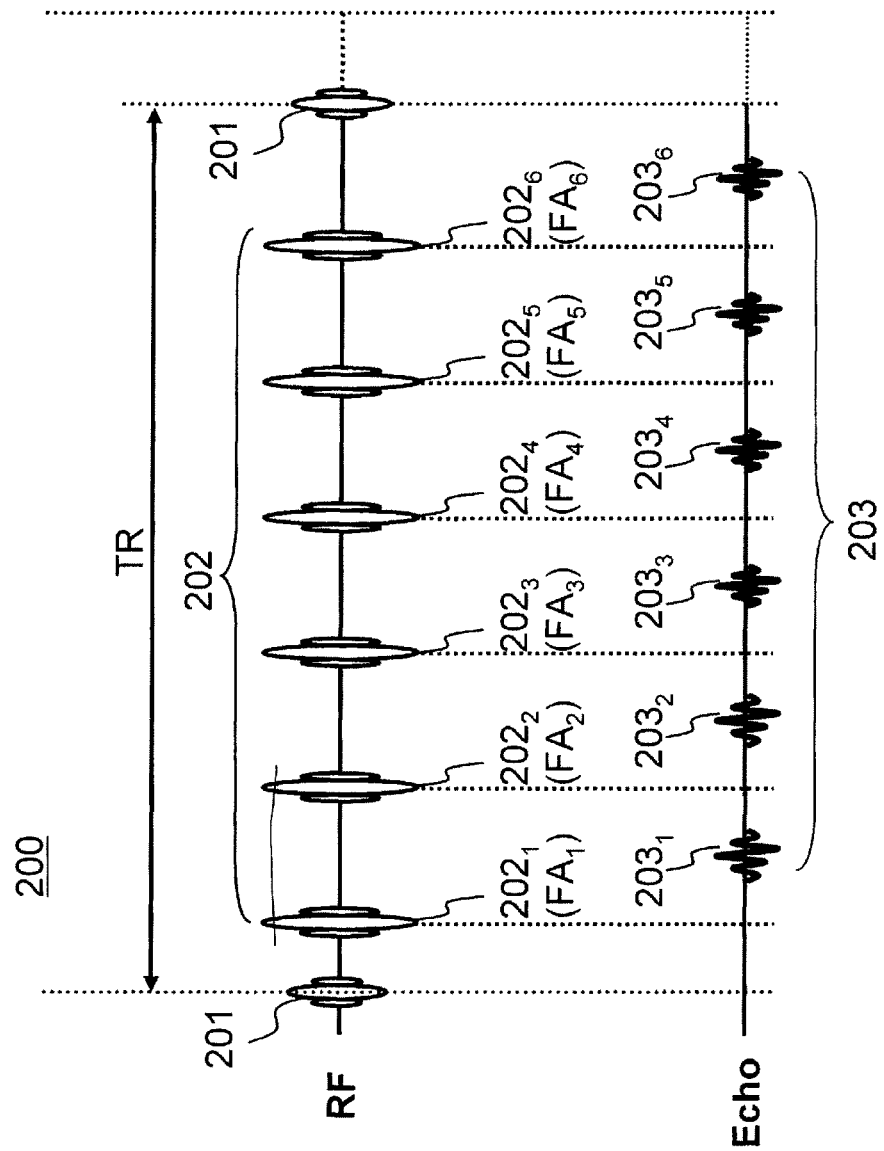
FIG. 2 is an explanatory view for explaining the pulse sequence of the FSE sequence.

FIG. 2 shows the application timing of an RF pulse of an FSE pulse sequence 200 and the acquisition timing of an echo signal. As shown in this diagram, a plurality of (here, a case of six is illustrated as an example) refocus RE pulses 202 ($202_1$, $202_2$, $202_3$, $202_4$, $202_5$, $202_6$) are applied during the TR after the application of an excitation RE pulse (90° pulse) 201. In addition, an echo signal 203 ($203_1$, $203_2$, $203_3$, $203_4$, $203_5$, $203_6$) is measured after the application of each refocus RE pulse 202. The signal strength of the obtained echo signal 203 is assumed to be SS. In addition, in the signal strength SS used herein, a strength change caused by various kinds of encoding is neglected as described above.

In the present embodiment, a pulse sequence based on the VRFA is used in which each flip angle (FA: $FA_1$, $FA_2$, $FA_3$, $FA_4$, $FA_5$, $FA_6$) of the refocus RF pulse 202 is variable.

Hereinafter, in the present embodiment, it is assumed that N (N is a natural number) refocus RE pulses are applied after one excitation RE pulse 201, and each refocus RF pulse will be expressed as a refocus RF pulse $202_n$ (n is a natural number satisfying $1 \leq n \leq N$). The subscript n is given in order of application. In addition, the flip angle of the refocus RF pulse $202_n$ applied for the n-th time is expressed as $FA_n$. In addition, the flip angle $FA_n$ of the refocus RF pulse $202_n$ applied for the n-th time is called n-th FA. In addition, an echo signal $203_n$ measured immediately after the refocus RE pulse $202_n$ applied for the n-th time is set, and the echo number is assumed to be n. In addition, when there is no need to distinguish the echo number in particular, they are called the refocus RF pulse 202, the flip angle FA, the echo signal 203, and the signal strength SS.

In addition, a sequential arrangement (a series of FA values) of values of the first to N-th flip angles FA is called an FA changing pattern FAP, and a sequential arrangement of the signal strength SS of the first to N-th echo signals 203 is called a signal strength changing pattern (SSP). That is, the FA changing pattern FAP is configured to include the FA of each refocus RF pulse, and the signal strength changing pattern SSP is configured to include the signal strength SS of each echo signal (echo number) obtained for each refocus RF pulse.

In the present embodiment, the FA changing pattern (a series of FA values of refocus RF pulses 202) is determined so as to almost maximize the SNR of an obtained image even if there is signal correction.

Figure 3:
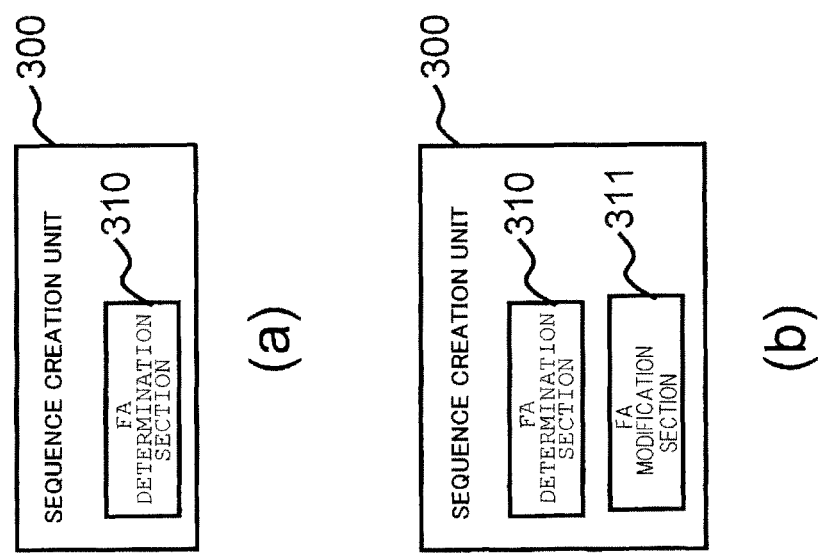
FIG. 3(a) is a functional block diagram of a sequence creation unit of the first embodiment.
FIG. 3(b) is a functional block diagram of a sequence creation unit in a modification of the first embodiment.

In order to realize this, a sequence creation unit 300 of the present embodiment includes an FA determination section 310 that determines the FA changing pattern, as shown in FIG. 3(a). The FA determination section 310 performs an FA determination process for determining the FA (FA changing pattern) of each refocus RF pulse 202 so that the SNR of the image almost becomes a maximum under the given conditions.

The FA determination section 310 is realized by maximizing the SNR, for example, by minimizing the noise amplification factor NA defined as the square root of the mean (Root Mean Square (RMS)) of the square of the reciprocal of the signal strength SS of each echo signal that forms the signal strength changing pattern SSP. This noise amplification factor NA is equivalent to the noise amplification factor when the frequency characteristics are neglected in the case of performing signal correction according to the signal strength SS. As described above, when there is signal correction, the signal strength of echo signals arranged in a region other than the center of k-space also influences the SNR. By using the noise amplification factor NA defined in this manner, it is possible to evaluate the SNR in consideration of the signal strength in a region other than the center of k-space. In addition, it is also possible to consider a noise amplification factor to which other weighting is given, such as considering a filter of post-processing.

In order to calculate the FA changing pattern FAP to minimize the noise amplification factor NA, a general optimization method is used. The initial value of the FA changing pattern FAP when the optimization method is used, that is, the initial value of the FA value of each refocus RF pulse is set in advance, for example. The initial value may be input as the imaging condition by the operator.

As the optimization method used, for example, there is a steepest descent method. The initial values of all FA values are set to 0°, for example. When using the steepest descent method, the FA determination section 310 calculates a partial derivative (difference quotient in the calculation) of the noise amplification factor NA with respect to the FA changing pattern FAP whenever the FA changing pattern FAP is changed, and updates the FA changing pattern FAP by subtracting a value, which is obtained by multiplying the partial derivative by the positive integer set in advance, from the FA changing pattern FAP. For example, the update of the FA changing pattern FAP is repeated a predetermined number of times. Then, the FA changing pattern FAP that is finally obtained is determined as the target FA changing pattern FAP and is output. In addition, the positive integer that multiplies the partial derivative may be set for each refocus RF pulse.

Figure 4:
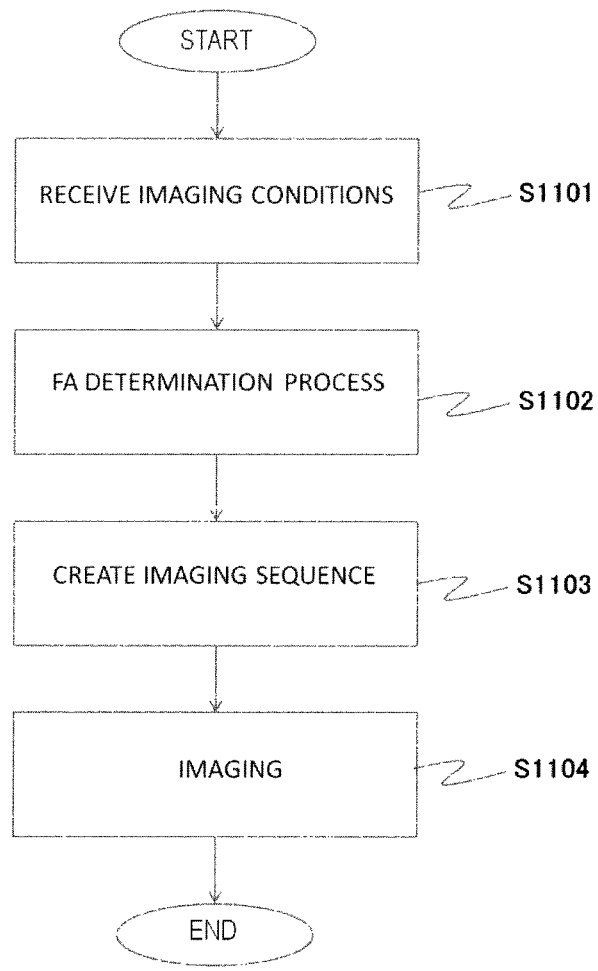
FIG. 4 is a flow chart of imaging processing of the first embodiment.

Next, the flow of the process at the time of imaging by the signal processing system 70 of the present embodiment will be described. FIG. 4 is a process flow at the time of imaging of the present embodiment.

When imaging conditions are input from the operator, the signal processing system 70 of the present embodiment receives the imaging conditions (step S1101). Then, the sequence creation unit 300 causes the FA determination section 310 to determine the FA (FA changing pattern FAP) of each refocus RE pulse using the received imaging conditions (FA determination process: step S1102), and creates an imaging sequence using the determined FA (FA changing pattern FAP) of each refocus RE pulse and the imaging conditions (step S1103).

Using the created imaging sequence, the signal processing system 70 gives an instruction to the sequencer 40 to execute imaging (step S1104).

Here, a user interface (UI) screen 400 on which the operator sets T1 and T2 as imaging conditions in step S1101 is shown in FIG. 5(a). The UI screen 400 includes an imaging condition setting region 410 to receive the input of imaging conditions. The imaging condition setting region 410 includes a T1 input column 401 to receive the input of T1 and a T2 input column 402 to receive the input of T2. The UI screen 400 is displayed on the display device 74, and the operator sets the imaging conditions, which include various parameters required in the imaging of the MRI apparatus 100, through the UI screen 400 using the input device 75.

Figure 6:
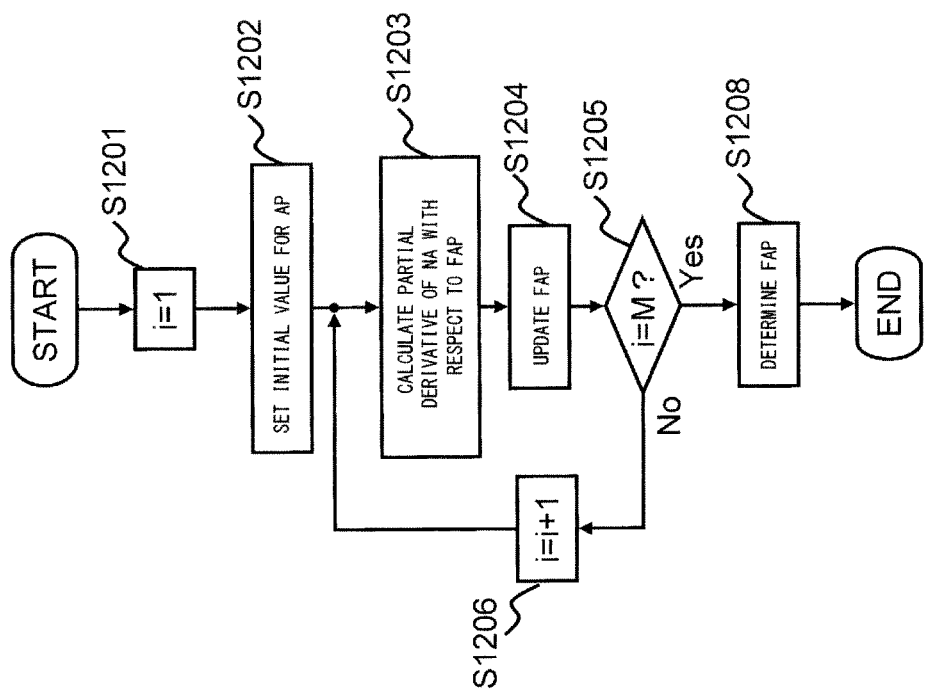
FIG. 6 is a flow chart of an FA determination process of the first embodiment.

Next, the flow of the FA determination process by the FA determination section 310 in step 31102 will be described. FIG. 6 is a process flow of the FA determination process of the present embodiment. Here, a case where the FA changing pattern FAP is calculated using the steepest descent method will be described as an example. In addition, it is assumed that determination as convergence is performed according to whether or not the convergence determination has been repeated M times (M is a natural number).

The FA determination section 310 sets 1 in a counter i to count the number of repetitions (step S1201). Then, the initial value of the FA of each refocus RE pulse is set for the FA changing pattern FAP (step S1202). For example, all initial values are set to 0°.

Then, the FA determination section 310 calculates a partial derivative (difference quotient in the calculation) of the noise amplification factor NA with respect to the FA changing pattern FAP (step S1203). Here, using an inter echo time (IET) and longitudinal relaxation time (T1) and transverse relaxation time (T2) of the target nuclide, the signal strength changing pattern SSP is first calculated from the FA changing pattern FAP by the method of the EPG disclosed in NPL 2. Then, using each signal strength SS that forms the signal strength changing pattern SSP, the noise amplification factor NA is calculated and the partial derivative is calculated. In addition, in order to calculate the signal strength changing pattern SSP from the FA changing pattern FAP, a Bloch equation may also be used as it is.

Although the details of the EPG are as disclosed in NPL 2, the outline is as follows. In the EPG, the state of the echo signal 203 is divided into a transverse magnetization component and a longitudinal magnetization component in each dephasing level. Here, the dephasing level indicates how much magnetization has spread due to the gradient magnetic field between refocus RE pulses or the like. If the magnetization is completely refocused in a state where the refocus RF pulse is exactly a 180° pulse, the dephasing level is inverted and returned every time by the same gradient magnetic field. However, if the refocus RF pulse is not exactly a 180° pulse, a component that is not returned appears, and a state where the dephasing level has advanced by one phase remains. The dephasing level is accumulated or canceled by applying a plurality of refocus RF pulses. In this case, the dephasing level advances up to the n phase or returns to the zero phase.

An echo signal is generated when the dephasing level returns to the zero phase. Therefore, a timing at which the dephasing level returns to the zero stage can be calculated by storing all the past dephasing levels. In the FSE, gradient magnetic fields between the respective refocus RF pulses are balanced, and the dephasing levels overlap each other. Accordingly, the FSE can be simply considered as only an integer, such as n stages. That is, the state of the echo signal $203_n$ is determined from the state of the echo signal $203_{n-1}$, $FA_n$, T1, T2, and IET. Using this, the state (signal strength) of the echo signal 203 can be sequentially calculated.

When the partial derivative is obtained, the FA determination section 310 updates the FA changing pattern FAP using the obtained partial derivative (step S1204). Here, the updated FA changing pattern FAP is obtained by subtracting a value, which is obtained by multiplying the partial derivative by the positive integer set in advance, from the FA changing pattern FAP before updating as described above.

Then, it is determined whether or not the process has been repeated M times (step S1205). When it is determined that the process has been repeated M times, the FA changing pattern FAP at that point in time is determined as a processing result (step S1208), and the process is ended.

On the other hand, if the number of repetitions is less than M times in step S1205, i is incremented by 1 (step S1206), and the process returns to step S1203.

In addition, although convergence determination is performed by the number of repetitions for the sake of simplicity, the convergence determination is not limited thereto. For example, when the partial derivative of the noise amplification factor NA is sufficiently small, determination as convergence may be made. In this case, a threshold value used in determination is set in advance, and determination as convergence may be made when the value of the partial derivative becomes equal to or less than the threshold value.

In addition, the optimization method used in the FA determination process is not limited to the steepest descent method. For example, it is also possible to change the FA changing pattern FAP in a round robin method, calculate the noise amplification factor NA for each FA changing pattern FAP, and set the FA changing pattern FAP, for which the minimum NA of the calculated noise amplification factors NA is obtained, as a processing result.

In addition, since the effect at the FA other than 0° to 180° is the same as the effect at the FA of 0° to 180°, the range for changing the FA in the optimization method may be limited to 0° to 180°. In addition, the range may be further narrowly limited. If the lower limit of the range for changing the FA becomes high, resistance against movement is increased. If the upper limit of the range for changing the FA becomes low, the power of the refocus RF pulse can be suppressed. These upper and lower limits may be stored in advance in the MRI apparatus 100, or may be input by the operator.

FIGS. 7(a) and 7(b) show examples of the signal strength changing pattern SSP 511 and the FA changing pattern FAP 512, respectively, to minimize the noise amplification factor NA, which are obtained as a result of search using the above-described method. Here, echo train length ETL, inter echo time IET, T1 of the target, and T2 of the target are set to 80, 0.0073 sec, 1 sec, and 0.1 sec, respectively. In addition, as described above, the signal strength SS of each echo signal that forms the signal strength changing pattern SSP is a value normalized with the virtual signal strength of the excitation moment as 1. In addition, in both graphs, the vertical axis indicates signal strength and FA [deg], and the horizontal axis indicates an echo number.

As described above, according to the present embodiment, the noise amplification factor NA by which the SNR can be evaluated in consideration of signal correction is introduced, and an FA changing pattern to minimize this is determined using the optimization method. Therefore, according to the present embodiment, since signal correction or the like is performed, an FA changing pattern to obtain the maximum SNR can be determined even in the multi-echo imaging in which echo signals arranged in a region other than the center of k-space influence the SNR.

In addition, according to the present embodiment, multi-echo imaging is performed by applying each refocus RF pulse at the FA specified in the FA changing pattern determined in this manner. Therefore, according to the present embodiment, the operator can obtain an image, which has the maximum SNR in consideration of signal correction, in the multi-echo imaging just by inputting the imaging conditions.

In addition, in the present embodiment, the sequence creation unit 300 creates an imaging sequence using the FA changing pattern FAP determined by the FA determination section 310 as it is, but is not limited thereto.

The FA changing pattern FAP determined by the FA determination section 310 may be modified according to the restriction on the range of the FA or the like.

A functional block diagram of the sequence creation unit 300 in this case is shown in FIG. 3(b). As shown in this diagram, the sequence creation unit 300 includes an FA modification unit 311 in addition to the FA determination section 310.

The FA modification unit 311 modifies the FA changing pattern determined by the FA determination section 310 according to the rule set in advance, hereinafter, a specific modification method will be described with reference to the diagrams.

First, a case where the range of the FA is limited and the FA modification unit 311 modifies the FA of each refocus RF pulse specified in the FA changing pattern FAP so as to fit in the range will be described as an example.

In addition, although the example where the restriction on the range of the FA is applied as the restriction conditions in the FA determination section 310 has been described as a modification in the above embodiment, this modification and modification after FA changing pattern determination may be combined. In addition, only the upper limit may be limited by the FA determination section 310, and the FA changing pattern FAP for which only the lower limit is obtained may be modified.

Hereinafter, a case where the upper limit is already limited by the FA determination section 310 and the FA modification unit 311 modifies the obtained FA changing pattern FAP so as to fit to the lower limit FAL will be described as an example. FIG. 8(a) is an explanatory view for explaining an example of the modification method. Here, the upper limit of the FA is assumed to be FAH, and the lower limit of the FA is assumed to be FAL.

In this case, as shown in this diagram, the FA modification unit 311 scales an FA changing pattern before modification FAP 601 around the upper limit FAH so as to fit to the lower limit FAL. The result is assumed to be an FA changing pattern after modification FAP' 602. Here, scaling around the upper limit FAH is assumed to multiply a difference (FA−FAH) between each FA value, which forms the FA changing pattern before modification FAP 601, and the upper limit by (FAL−FAH)/(Famin−FAH) and perform conversion into a value obtained by adding the result to the upper limit FAH.

The sequence creation unit 300 creates an imaging sequence using the FA changing pattern after modification FAP' by the FA modification unit 311.

In addition, as shown in FIG. 8(b), the modification method for making the FA fall within a predetermined range may be a modification in which the first FA to the minimum FA (FAmin: assumed to be an m-th FA) are made to fit to the lower limit FAL by scaling and the subsequent FA is set to the lower limit FAL if the FA is equal to or less than the lower limit. Here, the FA changing pattern after modification FAP' is shown in a graph 603.

Next, a case where the FA modification unit 311 modifies a predetermined FA to a predetermined value will be described as an example. In this case, other FAs are modified so as to change smoothly from the minimum FA to the maximum FA. FIG. 9(a) is an explanatory view for explaining an example of the modification method. Here, the FA to obtain echo signals arranged near the center of k-space is assumed to be the FA modified to the above-described predetermined value. The FA to obtain echo signals arranged near the center of k-space is assumed to be the n-th FA, and a predetermined value after modification is assumed to be FA1. Here, FAmin, which is the minimum FA within the FA changing pattern before modification FAP, is assumed to be the m-th FA, and n>m. The FA changing pattern before modification FAP is shown in a graph 601, and the FA changing pattern FAP' after modification is shown in a graph 604.

In this case, for example, the m-th FA to the n-th FA are moved forward (moved in a time direction) so that the p-th pulse, which becomes approximately the FA1, becomes an n-th pulse, and then scaling in the FA value direction around the n-th FA is performed so that smooth connection to the m-th FA is made. The FA after the n-th FA is scaled in the FA value direction with the upper limit FAH as the center, thereby being smoothly connected to the n-th FA.

In addition, as shown in FIG. 9(*b*), the FA modification unit 311 may eliminate the restriction of "below the upper limit FAH" for the FA of a stabilization pulse portion in modification of the FA changing pattern FAP.

In addition, the stabilization pulse is a pulse applied in order to stabilize the echo signal strength, and is configured to include a predetermined number of echo signals from the head of the echo train. In this case, the first FA to the FAmin (m-th FA) are scaled in the FA value direction with 180° as the center using the above-described method, and the FA after FAmin is modified to the lower limit FAL if the FA is equal to or less than the lower limit. The FA changing pattern after modification FAP' is shown in a graph 605.

In addition, although the FA is determined whenever the imaging conditions are set in the embodiment described above, the present invention is not limited thereto. For example, the FA changing pattern FAP may be calculated in advance for each parameter required in the FA determination process, such as T1, T2, ETL, and IET, and the calculation result may be stored in the storage device 72 or the external storage device 73 as an FA changing pattern database.

In this case, the sequence creation unit 300 may not include the FA determination section 310. That is, when imaging conditions are set, the sequence creation unit 300 extracts the FA changing pattern FAP corresponding to the imaging conditions from the FA changing pattern database and creates an imaging sequence using the FA changing pattern FAP.

Figure 10:
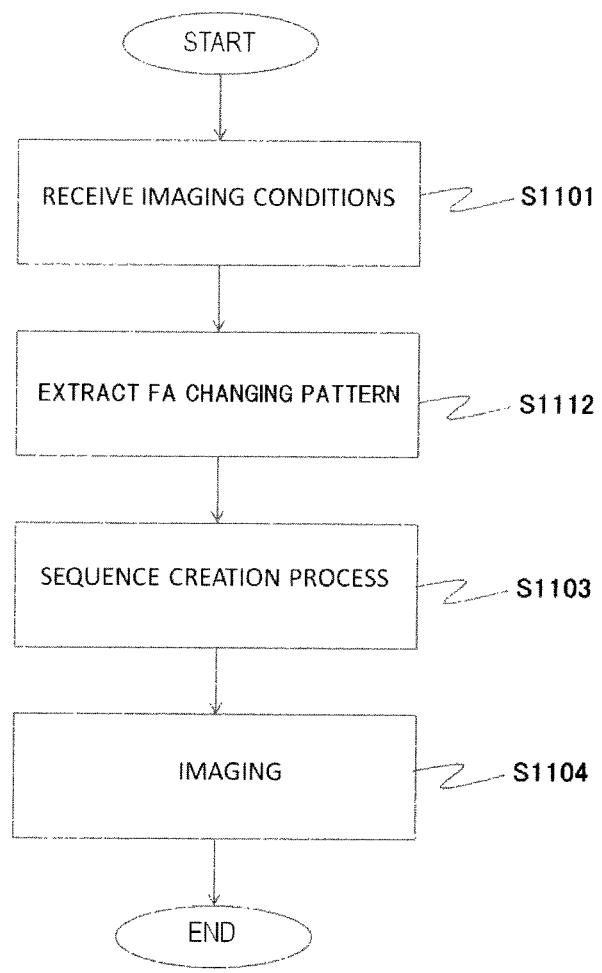
FIG. 10 is a flow chart of a modification of the imaging processing of the first embodiment.

The flow of an imaging process in this case is shown in FIG. 10. Here, the same reference numeral is given to the same processing as in FIG. 4. As shown in this diagram, when imaging conditions are input from the operator, the signal processing system 70 receives the imaging conditions (step S1101). Then, the sequence creation unit 300 extracts the FA changing pattern FAP corresponding to the received imaging conditions from the FA changing pattern database (step S1112). Then, the sequence creation unit 300 creates an imaging sequence using the extracted FA changing pattern FAP and the imaging conditions (step S1103). Using the created imaging sequence, the signal processing system 70 gives an instruction to the sequencer 40 to perform imaging (step S1104).

In addition, when the FA changing pattern FAP corresponding to the received imaging conditions is not present in the FA changing pattern database in step S1112, the FA changing pattern FAP closest to the received imaging conditions may be selected or interpolated.

In addition, also in this case, the extracted FA changing pattern may be modified after step S1112.

In addition, although the operator directly inputs T1 and T2 as imaging conditions in the embodiment described above, the information specified by the operator is not limited thereto. The information specified by the operator may be information by which T1 and T2 can be specified. For example, the operator may set target tissue instead of T1 and T2. In this case, T1 and T2 values of each tissue are stored in the storage device 72 or the external storage device 73. When target tissue is specified, the sequence creation unit 300 extracts T1 and T2 values corresponding to the target tissue from the storage device 72 or the like and determines the FA changing pattern FAP using the T1 and T2 values, thereby creating an imaging sequence.

In this case, as shown in FIG. 5(*b*), the UI screen 400 includes a target tissue input column 403, instead of the T1 input column 401 and the T2 input column 402, in the imaging condition setting region 410.

In addition, when a plurality of target tissues is present, the average value of each of T1 and T2 of all tissues to be imaged may be adopted. In addition, it is also possible to calculate the FA changing pattern FAP for each tissue using T1 and T2 of each tissue and average the FA changing pattern FAP for each tissue to set the final FA changing pattern FAP. When calculating the average, a weighting may be given according to the distribution or the volume of the tissue inside an object to be imaged.

Figure 11:
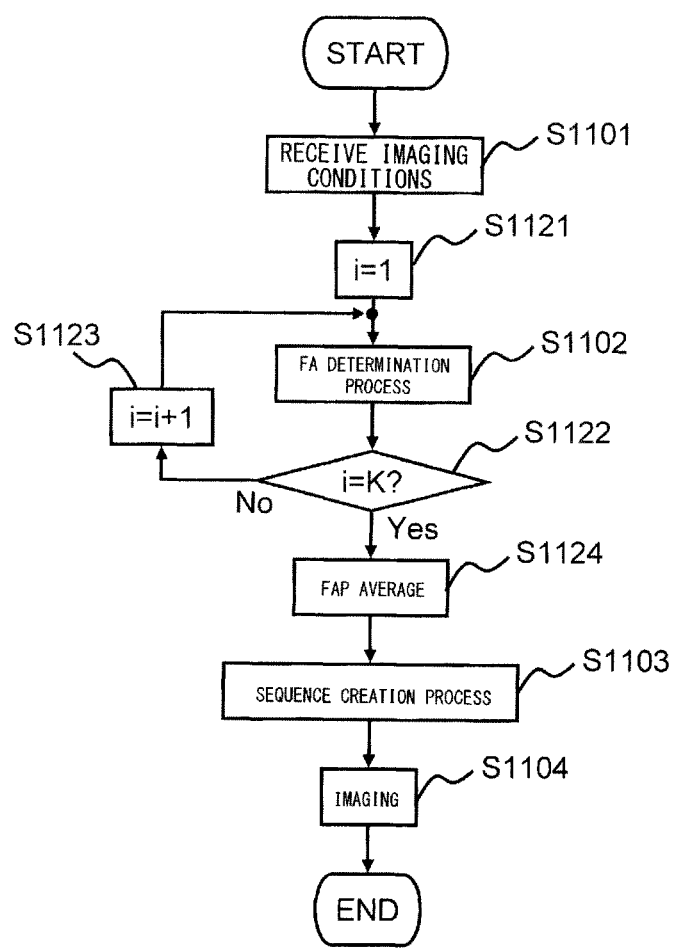
FIG. 11 is a flow chart of the modification of the imaging processing of the first embodiment.

FIG. 11 shows a process flow when the FA changing pattern FAP of each tissue is calculated using T1 and T2 and then the average is taken. Here, there are K species (K is a natural number) of tissues, and a case of the first embodiment will be described as an example.

When imaging conditions are input from the operator, the signal processing system 70 of the present embodiment receives the imaging conditions (step S1101).

Then, the sequence creation unit 300 causes the FA determination section 310 to determine the FA of each refocus RF pulse using the received imaging conditions. In this case, in this modification, the FA determination section 310 calculates each FA changing pattern by performing the FA determination process for each of the input T1 and T2 (steps S1121, S1102, S1122, and S1123).

Then, the sequence creation unit 300 calculates an average of the FA changing pattern for each of T1 and T2 and sets it as the FA changing pattern (step S1124).

Then, the sequence creation unit 300 creates an imaging sequence using the calculated FA (FA changing pattern) of each refocus RF pulse and the imaging conditions (step S1103). Using the created imaging sequence, the signal processing system 70 gives an instruction to the sequencer 40 to perform imaging (step S1104).

Figure 12:
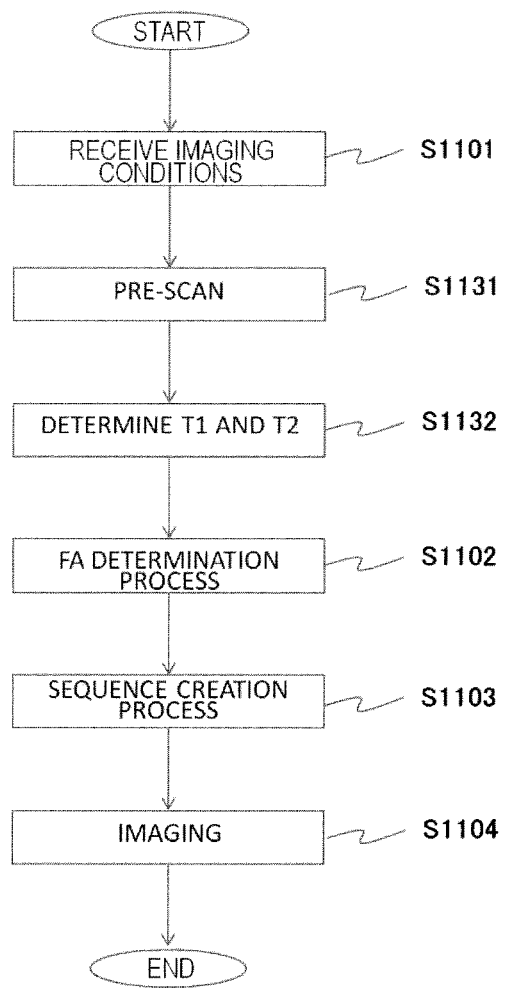
FIG. 12 is a flow chart of the modification of the imaging processing of the first embodiment.

In addition, T1 and T2 may also be calculated by a pre-scan. The flow of an imaging process in this case is shown in FIG. 12. This process is basically the same as the imaging process in the first embodiment. However, when imaging conditions are received, the signal processing system 70 performs a pre-scan (step S1131), determines T1 and T2 (step S1132), and proceeds to the FA determination process S1102.

In addition, also in the modification shown in FIGS. 11 and 12, the FA changing pattern corresponding to T1 and T2 may be extracted from the database stored in advance in the storage device 72 or the like instead of the FA determination process.

Second Embodiment

Next, a second embodiment to which the present invention is applied will be described. In the first embodiment, the FA of all refocus RF pulses is changed in a possible range to search for the FA changing pattern that maximizes the SNR (minimizes the noise amplification factor NA). That is, the number of parameters used in a search (search parameter) is the total number of refocus RF pulses (number of echoes) N applied during one TR. For example, the signal strength SS that can be converted into the FA and vice versa can be set as a search parameter. Also in this case, however, the number of search parameters is N. In the present embodiment, the number of search parameters is set to be smaller than N.

The configuration of the MRI apparatus 100 and the sequence creation unit 300 of the present embodiment is basically the same as that in the first embodiment. In addition, the flow of the imaging process by the signal processing system 70 of the present embodiment is the same as that in the first embodiment. Therefore, explanation regarding these will be omitted. Hereinafter, the present embodiment will be described focusing on the different configuration from the first embodiment.

In the present embodiment, as described above, L (L is a natural number satisfying L<N) search parameters (collectively referred to as CTRL) equal to or less than the number of echoes N are prepared, and the FA changing pattern FAP that maximizes the SNR is determined using the search parameters. In addition, the signal strength and the FA can be converted into each other using the EPG, the Prospective EPG, or the like. Accordingly, a search parameter may indicate the FA, or may indicate the signal strength. In addition, in contrast to the EPG, the Prospective EPG is a technique for calculating the FA changing pattern FAP from the signal strength changing pattern SSP.

In the Prospective EPG, the FA changing pattern FAP is calculated by calculating the FA to realize the signal strength SS in order from the head of the signal strength changing pattern SSP. In the process, there may be no FA that allows realizing the signal strength SS, or the FA that allows realizing the signal strength SS may not be present within the set range. Such a state is called "FA is saturated".

When the FA is saturated, the FA changing pattern FAP is calculated by determining the FA according to the rule set in advance. For example, processing, such as setting all the FA after saturation to the upper limit FAH set in advance, is performed.

Figure 13:
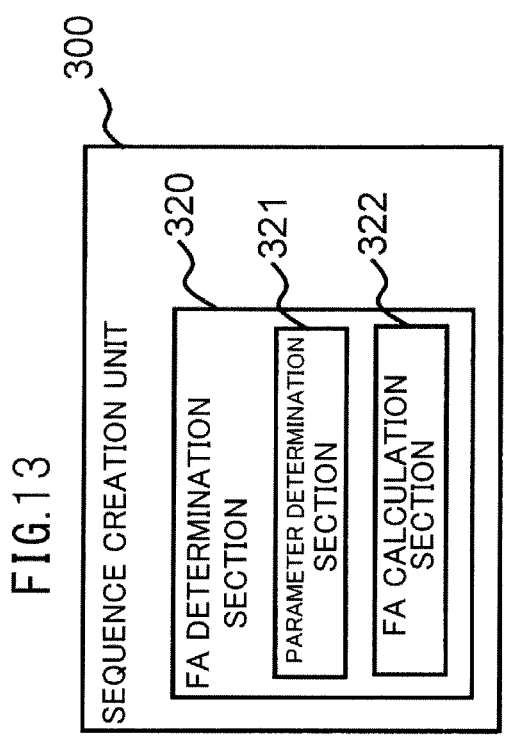
FIG. 13 is a functional block diagram of a sequence creation unit of a second embodiment.

As shown in FIG. 13, an FA determination section 320 of the present embodiment includes a parameter determination section 321 that determines the search parameter CTRL to maximize the SNR and an FA calculation section 322 that calculates each FA value (FA changing pattern FAP) from the search parameter CTRL.

Hereinafter, the FA determination process of the present embodiment will be described through a specific example. Here, a series of FA values obtained by thinning out every other "N" FA values that form the FA changing pattern FAP is used as the search parameter CTRL. The number of search parameters CTRL is set to L (L=N/2: N is an even number, and L=(N+1)/2: N is an odd number).

The FA calculation section 322 calculates the FA changing pattern FAP from the search parameter CTRL. For example, when the search parameter CTRL is created by thinning out the "N" FA values that form the FA changing pattern FAP, the FA changing pattern FAP is calculated using a method, such as linear interpolation.

The parameter determination section 321 converts the search parameter CTRL into the FA changing pattern FAP using the FA calculation section 322, and determines the search parameter CTRL that maximizes the SNR, that is, the search parameter CTRL that minimizes the noise amplification factor NA using the same search method as in the first embodiment.

Figure 14:
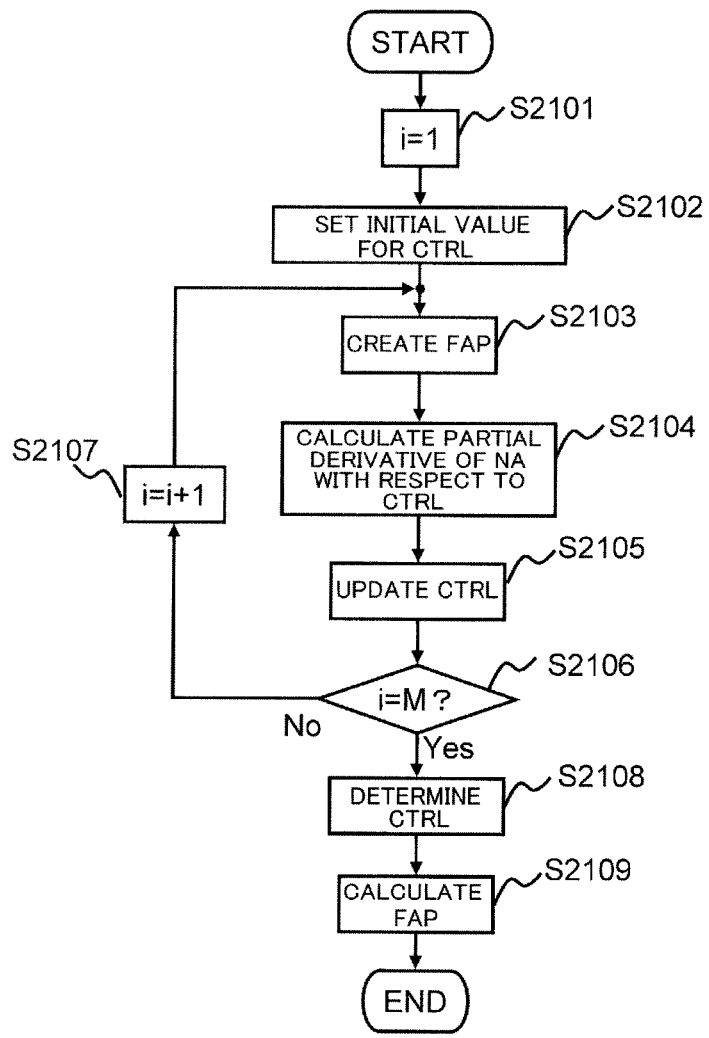
FIG. 14 is a flow chart of an FA determination process of the second embodiment.

FIG. 14 shows the flow of the FA determination process of the present embodiment. Also in the present embodiment, value update is repeated M times using the steepest descent method as in the first embodiment.

First, the parameter determination section 321 sets 1 in the counter i to count the number of repetitions (step S2101). Then, an initial value of the search parameter CTRL is set (step S2102). For example, all initial values are set to 0 as in the first embodiment. Then, the parameter determination section 321 creates the FA changing pattern FAP from the obtained search parameter CTRL using the EA calculation section 322 (step S2103).

Then, the parameter determination section 321 calculates a partial derivative (difference quotient in the calculation) of the noise amplification factor NA with respect to the search parameter CTRL (step S2104). Here, as in the first embodiment, using IET, T1, and T2, the signal strength changing pattern SSP is calculated from the FA changing pattern FAP calculated in step S2103 by the EPG or the like. Then, the noise amplification factor NA and the partial derivative are calculated using the calculated signal strength changing pattern SSP.

Then, the search parameter CTRL is updated using the same method as in the first embodiment (step S2105). That is, the updated search parameter CTRL is obtained by subtracting a value, which is obtained by multiplying the value of the partial derivative obtained in step S2104 by the positive integer set in advance, from each value of the search parameter CTRL before the update.

Then, the parameter determination section 321 determines whether or not the process has been repeated M times (step S2106). If the number of repetitions is less than M times, the counter i is incremented by 1 (step S2107), and the process returns to step S2103.

On the other hand, when the process has been repeated M times in step S2106, the parameter determination section 321 determines the search parameter CTRL at that point in time as the search parameter CTRL that maximizes the SNR (step S2108). Then, the FA determination section 320 causes the FA calculation section 322 to calculate the FA changing pattern from the search parameter CTRL determined in step S2108 (step S2109), and the process is ended.

In addition, also in the present embodiment, the method of searching for the minimum value of the noise amplification factor NA is not limited thereto. For example, as in the first embodiment, the FA changing pattern FAP calculated from the search parameter CTRL by which the minimum NA is obtained, among the noise amplification factors NA calculated for each search parameter CTRL changed in a round robin method instead of the steepest descent method, may be set as a processing result.

In addition, although convergence determination is performed by the number of repetitions, the convergence determination is not limited thereto. For example, as in the first embodiment, convergence may be determined by the value of the partial derivative of the noise amplification factor NA.

As described above, according to the present embodiment, signal correction or the like is performed and the FA changing pattern to maximize the SNR can be determined in the multi-echo imaging even if echo signals arranged in a region other than the center of k-space influence the SNR, in the same manner as in the first embodiment. Therefore, since the imaging is performed using the FA changing pattern, it is possible to obtain an image having the large SNR in consideration of signal correction.

In addition, in the present embodiment, the number of parameters used in the search is smaller than that in the first embodiment. Therefore, compared with the first embodiment, it is possible to realize the best SNR with less calculation time.

In addition, the method of reducing the number of parameters is not limited to the above-described method. For example, a coefficient of the approximation expression of a curve showing the FA changing pattern FAP may be used as a search parameter, or a coefficient of the expression that defines a curve showing the signal strength changing pattern SSP may be used as a search parameter. Since the signal strength and the FA can be converted into each other by using the EPG, the Prospective EPG, or the like, the search parameter may indicate the FA or indicate the signal strength.

In addition, also in the present embodiment, the range for changing the FA may be set in advance so as to be limited in the optimization method as in the first embodiment. In addition, it is also possible to include the FA modification unit 311 that modifies the FA changing pattern FAP determined by the FA determination section 320.

In addition, the FA changing pattern FAP created in advance may be stored in the storage device 72 or the like so that the FA changing pattern FAP is extracted at the time of imaging.

In addition, it is possible to set the tissue to be imaged instead of T1 and T2. In addition, when there is a plurality of species of tissues to be imaged, the FA changing pattern may be calculated using the average value of the T1 and T2 values, or it is possible to calculate the FA changing pattern for each of the T1 and T2 values and calculate the average of the FA changing pattern. In addition, T1 and T2 may also be obtained by a pre-scan.

In addition, in the present embodiment, in step S2103, the FA changing pattern FAP and the signal strength changing pattern SSP are calculated from the search parameter CTRL, and the partial derivative of the noise amplification factor NA is calculated using the signal strength changing pattern SSP. However, the present invention is not limited to this method. For example, when generating the search parameter CTRL by thinning out the FA changing pattern as in the embodiment described above, the search parameter CTRL may be updated without calculating the FA changing pattern that is not thinned out. That is, the series of signal strength values that is thinned out is calculated only from the series of FA values extracted as the search parameter CTRL. Then, the noise amplification factor NA and the partial derivative are calculated from the series of signal strength values, thereby updating the search parameter CTRL.

Third Embodiment

Next, a third embodiment to which the present invention is applied will be described. In each embodiment described above, as a specific example, a parameter that is directly related to the FA changing pattern is controlled to minimize the noise amplification factor.

In the present embodiment, the signal strength changing pattern is changed to determine the signal strength changing pattern that minimizes the noise amplification factor, and the FA changing pattern that realizes the signal strength changing pattern is set as the FA changing pattern used in the imaging. That is, information specifying the signal strength changing pattern is used as the search parameter in the second embodiment.

The configuration of the MRI apparatus 100 and the sequence creation unit 300 of the present embodiment is basically the same as that in the second embodiment. In addition, the flow of the imaging process by the signal processing system 70 of the present embodiment is the same as that in the second embodiment. Therefore, explanation thereof will be omitted herein. Hereinafter, the present embodiment will be described focusing on the different configuration from the second embodiment.

Figure 15:
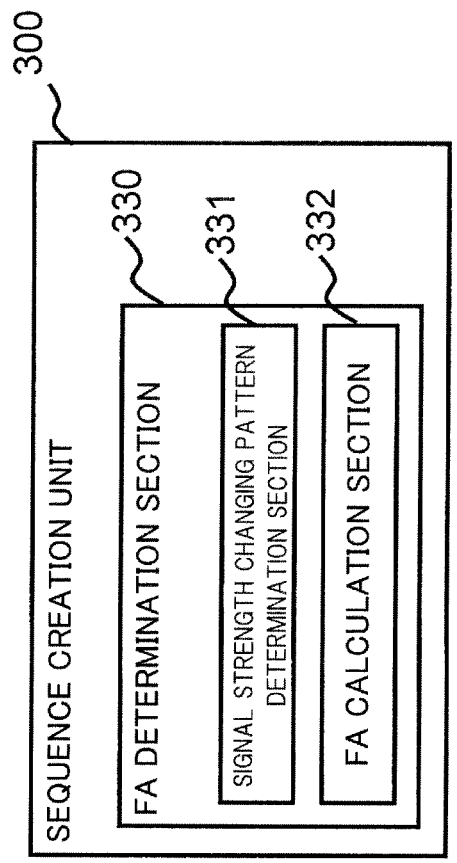
FIG. 15 is a functional block diagram of a sequence creation unit of a third embodiment.

In the present embodiment, as described above, information specifying the signal strength changing pattern SSP is used as a search parameter. The signal strength changing pattern SSP that maximizes the SNR is determined by changing the search parameter, and the FA changing pattern FAP is determined from the determined signal strength changing pattern SSP. In order to realize this, as shown in FIG. 15, an FA determination section 330 of the present embodiment includes a signal strength changing pattern determination section 331 that determines information specifying the signal strength changing pattern SSP, which maximizes the SNR, and an FA calculation section 332 that calculates the FA changing pattern FAP from the information specifying the signal strength changing pattern SSP, which is a search parameter.

The signal strength changing pattern determination section 331 expresses the signal strength changing pattern SSP as a predetermined function, and determines parameters (coefficient and the like) of the function, which is a search parameter, so that the noise amplification factor NA is minimized. In this case, as in the first and second embodiments, parameters of the function are determined using an optimization method, such as the steepest descent method.

Some cases were examined, and it could be seen that the noise amplification factor NA became almost a minimum when a part or all of the signal strength changing pattern SSP had a pattern asymptotically approaching an exponential function. In the present embodiment, a double exponential function expressed as in the following Expression (1) is used as a function of the signal strength SS(t).

$$SS(t)=(1-S0) \times \exp(-t/Ts)+S0 \times \exp(-t/T12) \quad (1)$$

Here, the time when the excitation RF pulse 201 is applied is assumed to be t=0. In addition, Ts=IET/log(2) is assumed. The exponential function of a time constant T12 is an exponential function that approaches asymptotically, and the exponential function of a time constant Ts is an exponential function showing an asymptotic change. The coefficient of the exponential function that approaches asymptotically is set to S0 (S0 is a positive number smaller than 1), and the coefficient of the exponential function showing an asymptotic change is set to (1−S0) so that S(0)=1 is satisfied.

In addition, assuming that the time when the n-th echo signal is acquired is $t_n$, the signal strength value $SS(t_n)$ of the echo signal at the time $t_n$ is expressed as in the following Expression (2).

$$SS(t_n)=(1-S0) \times \exp(-t_n/Ts)+S0 \times \exp(-t_n/T12) \quad (2)$$

The actual signal strength changing pattern SSP is formed by the signal strength value $SS(t_n)$ at "N" time $t_n$ that is the discrete value.

Therefore, the coefficient S0 and the time constant T12 of the double exponential function expressed as in Expressions (1) and (2) are used as search parameters in the present embodiment. In addition, the signal strength changing pattern SSP expressed by the search parameters (S0 and T12) may be a pattern that cannot be realized due to the saturation of the FA. In the calculation of the noise amplification factor NA, the FA changing pattern FAP is calculated using the Prospective EPS, the signal strength changing pattern SSP that is realized is calculated, and the noise amplification factor NA is calculated. Alternatively, a restriction not greatly deviating from the realizable signal changing pattern SSP may be added, and the noise amplification factor NA may be directly calculated from the signal strength changing pattern SSP expressed by the search parameters (S0 and T12). The added restriction is that all the FA excluding the final FA is not saturated, for example.

The FA calculation section 332 calculates the FA changing pattern FAP from the signal strength changing pattern SSP. In the present embodiment, the FA changing pattern FAP is calculated using the method of the Prospective EPG.

Figure 16:
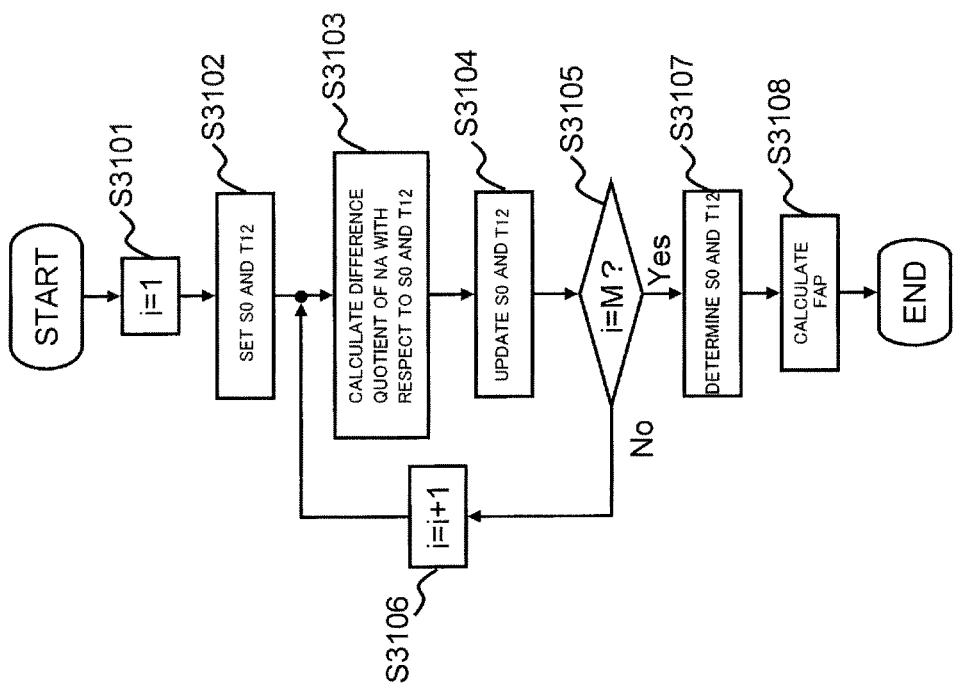
FIG. 16 is a flow chart of an FA determination process of the third embodiment.

FIG. 16 shows the flow of the FA determination process by the FA determination section 330 of the present embodiment. Also in the present embodiment, value update is repeated M times using the steepest descent method as in the first embodiment.

First, the signal strength changing pattern determination section 331 initializes the counter i to count the number of repetitions (step S3101). Then, initial values of the coefficient S0 and the time constant T12 that are search parameters are set (step S3102). The initial values are set in advance as in the first and second embodiments.

The partial derivative (difference quotient in the calculation) of the noise amplification factor NA with respect to the search parameter (S0, T12) is calculated using the signal strength changing pattern SSP specified by the coefficient S0 and the time constant T12 (step S3103). Then, the search parameter (S0, T12) is updated using the same method as in the first embodiment (step S3104). Here, the updated search parameter (S0, T12) is obtained by subtracting a value, which is obtained by multiplying the value of the partial derivative obtained in step S3103 by the positive integer set in advance, from the search parameter (S0, T12) before the update.

Then, the signal strength changing pattern determination section 331 determines whether or not the process has been repeated M times (step S3105). If the number of repetitions is less than M times, the counter i is incremented by 1 (step S3106), and the process returns to step S3103.

On the other hand, when the process has been performed M times in step S3105, the signal strength changing pattern determination section 331 determines the search parameter (S0, T12) at that point in time as the search parameter (S0, T12) that maximizes the SNR (step S3107). Then, the FA determination section 330 causes the FA calculation section 332 to calculate the FA changing pattern from the signal strength changing pattern SSP, which is specified by the search parameter (S0, T12) determined in step S3107, using the method of the Prospective EPS or the like (step S3108), and the process is ended.

As described above, according to the present embodiment, the noise amplification factor NA by which the SNR can be evaluated in consideration of signal correction is introduced, and an FA changing pattern to minimize this is determined using the optimization method, as in the first embodiment. Therefore, since signal correction or the like is performed, an FA changing pattern that maximizes the SNR can be determined even when echo signals arranged in a region other than the center of k-space influence the SNR. In addition, since imaging is performed using the FA changing pattern, it is possible to obtain an image having a high SNR in consideration of signal correction.

In addition, in the present embodiment, a coefficient when the signal strength changing pattern is expressed as a function is used as a search parameter. Therefore, since the number of parameters used in the search is small compared with the first embodiment, it is possible to realize the best SNR with less calculation time compared with the first embodiment.

In addition, although the coefficient S0 and the time constant T12 of the double exponential function expressed as in Expressions (1) and (3) are used as search parameters in the present embodiment, the present invention is not limited thereto. One or more of the coefficient S0, the time constant T12, and the time constant Ts may be used as search parameters.

In addition, the function showing the signal strength changing pattern SSP is not limited to Expressions (1) and (2). A function that approaches an exponential function asymptotically may be used. For example, Expression (3) or the like may be used.

$$SS(t)=(1-S0)\times(1/(1+t/Ts))+S0\times\exp(-t/T12) \qquad (3)$$

In addition, also in the present embodiment, the method of searching for the minimum value of the noise amplification factor NA is not limited thereto. For example, as in the first embodiment, the FA changing pattern FAP calculated from the search parameter (S0, T12) by which the minimum NA is obtained, among the noise amplification factors NA calculated for each search parameter (S0, T12) changed in a round robin method instead of the steepest descent method, may be set as a processing result.

In addition, although convergence determination is performed by the number of repetitions, the convergence determination is not limited thereto. For example, as in the first embodiment, convergence may be determined by the value of the partial derivative of the noise amplification factor NA.

In addition, also in the present embodiment, the range for changing the FA may be set in advance so as to be limited in the optimization method as in the first embodiment. When the FA is saturated, the FA calculation section 332 calculates the FA changing pattern FAP by changing the FA according to the rule set in advance. For example, the upper limit FAH set in advance is set as the FA when the signal strength SS is too large and there is no FA, and the lower limit FAL set in advance is set as the FA when the signal strength SS is too small and there is no FA.

In addition, it is also possible to include the FA modification unit 311 that modifies the FA changing pattern FAP determined by the FA determination section 320.

In addition, the FA changing pattern FAP created in advance using the method of the present embodiment may be stored in the storage device 72 or the like so that the FA changing pattern FAP is extracted at the time of imaging.

In addition, it is possible to set the tissue to be imaged instead of T1 and T2. In addition, when there is a plurality of species of tissues to be imaged, the FA changing pattern may be calculated using the average value of the T1 and T2 values, or it is possible to calculate the FA changing pattern for each of the T1 and T2 values and calculate the average of the FA changing pattern. In addition, T1 and T2 may also be obtained by a pre-scan.

A signal strength changing pattern 531 and an FA changing pattern 532 determined by the method of the present embodiment are shown by curves in FIGS. 17(a) and 17(b), respectively. Here, ETL, IET, T1 of the target, and T2 of the target are set to 80, 0.0073 sec, 1 sec, and 0.1 sec, respectively. In addition, the signal strength changing pattern was approximated by the double exponential function shown in Expression (1). In addition, the maximum value of the FA was set to 180°, and the FA was greatest at the time of FA saturation.

In these drawings, the signal strength changing pattern and the FA changing pattern calculated by the method of the first embodiment under the same conditions of ETL, IET, T1, and T2 are shown by dots. As shown in these diagrams, both are almost identical. Therefore, it can be seen that a signal strength change when the SNR is a maximum is expressed by the double exponential function.

Fourth Embodiment

Next, a fourth embodiment to which the present invention is applied will be described. The present embodiment is basically the same as the third embodiment, and a change in the signal strength is expressed as a function, and the FA changing pattern that minimizes the noise amplification factor is determined by changing the coefficient. In the present embodiment, however, the minimization procedure of the noise amplification factor NA is simplified by not allowing the saturation of the FA, thereby increasing the speed.

The configuration of the MRI apparatus 100 and the sequence creation unit 300 of the present embodiment is basically the same as that in the third embodiment. In addition, the flow of the imaging process by the signal processing system 70 of the present embodiment is the same as that in the third embodiment. Therefore, explanation thereof will be omitted herein. Hereinafter, the present embodiment will be described focusing on the different configuration from the third embodiment.

Figure 18:
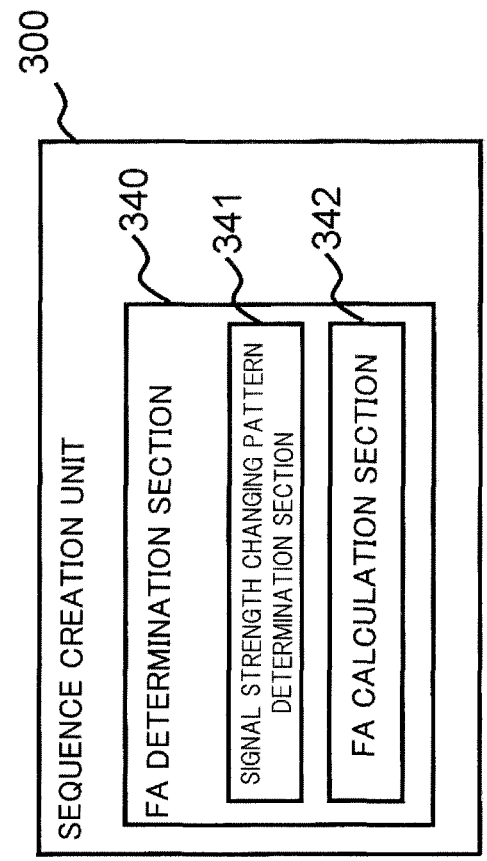
FIG. 18 is a functional block diagram of a sequence creation unit of a fourth embodiment.

As shown in FIG. 18, an FA determination section 340 of the sequence creation unit 300 of the present embodiment includes a signal strength changing pattern determination section 341 and an FA calculation section 342. In the present embodiment, as described above, the minimization procedure of the noise amplification factor NA is different from the third embodiment. Accordingly, a signal strength changing pattern determination process for minimizing the noise amplification factor NA by the signal strength changing pattern determination section 341 is different.

The signal strength changing pattern determination section 341 of the present embodiment adjusts the time constant T12 and the coefficient S0 in a set range, and performs a signal strength changing pattern determination process for determining the coefficient S0 and the time constant T12 to minimize the noise amplification factor NA.

Figure 19:
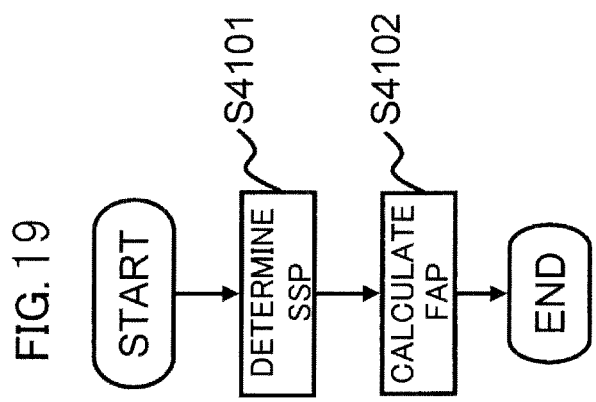
FIG. 19 is a flow chart of an FA determination process of the fourth embodiment.

In addition, the FA calculation section 342 of the present embodiment calculates the FA changing pattern FAP from signal strength changing pattern SSP, as in the third embodiment. In the present embodiment, the FA changing pattern FAP is calculated using the method of the Prospective EPG. That is, in the FA determination section 340 of the present embodiment, as shown in FIG. 19, the signal strength changing pattern determination section 341 determines the signal strength changing pattern SSP that maximizes the SNR (minimizes the noise amplification factor NA) (step S4101), and the FA calculation section 342 calculates the FA changing pattern FAP from the signal strength changing pattern SSP (step S4102).

Next, the signal strength changing pattern determination process by the signal strength changing pattern determination section 341 of the present embodiment will be described. The outline of the signal strength changing pattern determination process by the signal strength changing pattern determination section 341 of the present embodiment is as follows.

The time constant T12 and the coefficient S0 are alternately changed by regarding them as variables. First, the noise amplification factor NA is minimized by changing the coefficient S0 as a variable in a state where the time constant T12 is fixed. Specifically, S0 is maximized in a range where saturation does not occur. Then, the noise amplification factor NA is fixed to the minimum value, and the time constant T12 is changed as a variable, thereby obtaining the time constant T12 at which the FA (final FA) to obtain the final echo signal of the echo train becomes a minimum. By this process, even if the coefficient S0 is increased, saturation does not occur. Accordingly, it is possible to minimize the next noise amplification factor NA (maximize the coefficient S0). The final time constant T12 and coefficient S0 are obtained by repeating the above process a predetermined number of times.

Although a general optimization method may be used in the operation to maximize the coefficient S0 and the operation to minimize the final FA, a bisection method is used for the operation to maximize the coefficient S0 and a golden section method is used for the operation to minimize the final FA herein. In both the methods, convergence is simply guaranteed in a manner of narrowing the search range. In addition, the initial search section is stored in advance. Alternatively, the initial search section is set as an imaging parameter by the operator.

Figure 20:
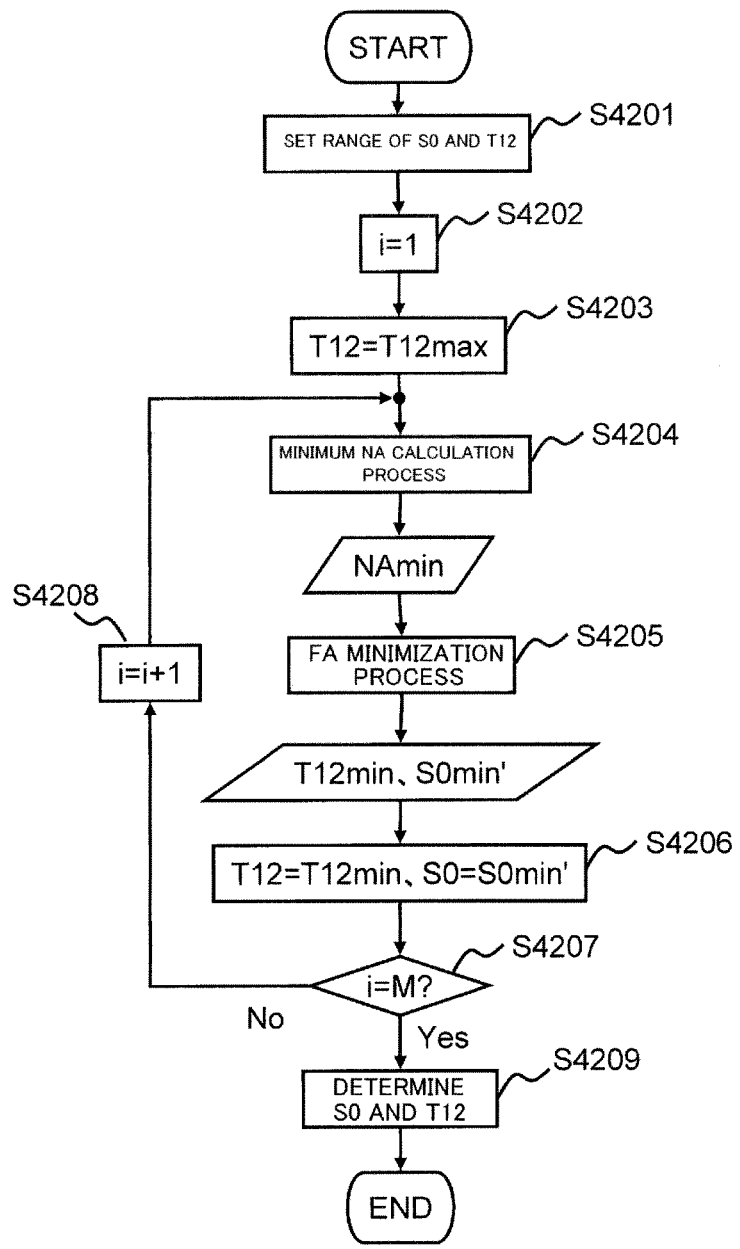
FIG. 20 is a flow chart of a signal strength changing pattern determination process of the fourth embodiment.

Hereinafter, the flow of the signal strength changing pattern determination process by the signal strength changing pattern determination section 341 of the present embodiment will be described. FIG. 20 is a process flow of the signal strength changing pattern determination process. Here, the signal strength changing pattern determination process is assumed to be repeated M times.

First, the signal strength changing pattern determination section 341 determines a range for changing the coefficient S0 and the time constant T12 (step S4201). The range of the coefficient S0 is assumed to be from 0 to 1, for example. The range of the time constant T12 is assumed to be from T1 of the target to 10 times of T1, for example. The counter i to count the number of times of processing is initialized (i=1) (step S4202). In addition, the time constant T12 is set to the maximum value T12max (step S4203).

Then, the noise amplification factor is minimized in a range where the flip angle FA is not saturated with the coefficient S0 as a variable in a state where the time constant T12 is fixed (step S4204), thereby obtaining a minimum noise amplification factor NAmin. This process is called a minimum noise amplification factor calculation process, and details thereof will be described later.

Then, the final FA (FAfin) is minimized with the time constant T12 as a variable in a state where the noise amplification factor NA is fixed to NAmin (step S4205). This process is called a final FA minimization process, and details thereof will be described later. In this case, since the noise amplification factor NA is fixed, coefficient S0 also changes with a change in the time constant T12. Then, a time constant T12 min and a coefficient S0min' to realize this are obtained, and are set as the time constant T12 and the coefficient S0 (step S4206).

It is determined whether or not the above process has been repeated a predetermined number of times (step S4207). When the above process has not been repeated a predetermined number of times, i is incremented by 1 (step S4208), and the process returns to step S4204 to repeat the process. On the other hand, when the above process has been repeated a predetermined number of times, the time constant T12 and the coefficient S0 at that point in time are determined as a calculation result (step S4209), and the process is ended.

Next, a minimum noise amplification factor calculation process for minimizing the noise amplification factor NA with the coefficient S0 as a variable in the above step S4204 will be described.

Figure 21:
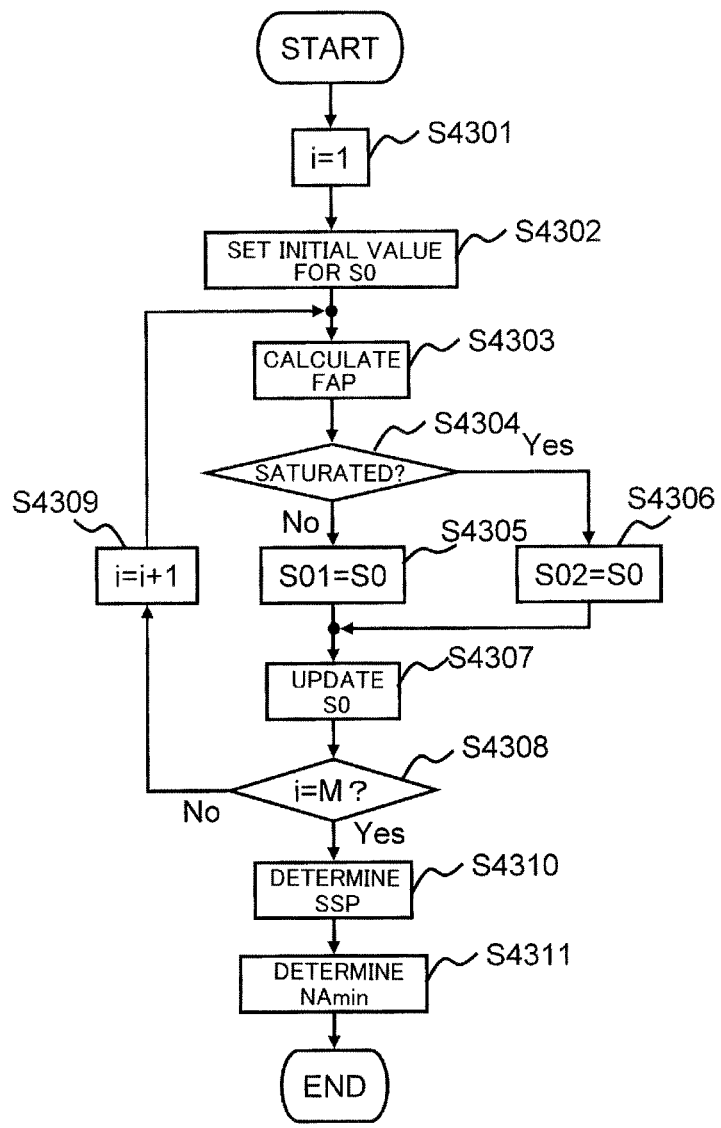
FIG. 21 is a flow chart of a minimum noise amplification factor calculation process of the fourth embodiment.

FIG. 21 is a process flow of the minimum noise amplification factor calculation process. Here, a case where the minimum noise amplification factor calculation process is repeated M times using a bisection method will be described as an example. The lower and upper limits of the coefficient S0 when the bisection method is used are assumed to be S01 and S02, respectively. Since the noise amplification factor NA monotonically decreases with respect to the coefficient S0, the maximum coefficient S0 with which the FA is not saturated is calculated.

As shown in this diagram, the signal strength changing pattern determination section 341 initializes the counter i (step S4301), and sets the initial value set in advance for the coefficient S0 (step S4302).

Here, (S01+S02)/2 is set as the initial value of the coefficient S0.

Then, the signal strength changing pattern determination section 341 calculates the FA changing pattern FAP from the signal strength changing pattern SSP using the coefficient S0 (step S4303). Then, it is determined whether or not the calculated FA changing pattern FAP is saturated (step S4304). When the calculated FA changing pattern FAP is not saturated, the lower limit S01 is updated to the current coefficient S0 (S01=S0: step S4305). On the other hand, when the calculated FA changing pattern FAP is not saturated, the upper limit S02 is updated to the current coefficient S0 (S02=S0: step S4306). Depending on the saturation, one of the lower limit S01 and the upper limit S02 is updated, and then the coefficient S0 is updated to (S01+S02)/2 using the lower limit S01 and the upper limit S02 after the update (step S4307).

Then, the signal strength changing pattern determination section 341 determines whether or not the process has been performed M times (step S4308). When the process has not been performed M times, the counter i is incremented by 1 (step S4309), and the process proceeds to step S4303.

On the other hand, when it is determined that the process has been repeated M times in step S4308, the signal strength changing pattern determination section 341 determines the signal strength changing pattern SSP with the lower limit S01 at that point in time as the coefficient S0 (step S4310). Then, the noise amplification factor NA is calculated using the above and the result is determined as a minimum noise amplification factor NAmin (step S4311), and the process is ended.

In addition, in the minimum noise amplification factor calculation process, the maximum coefficient S0 with which the FA is not saturated is preferably obtained. Accordingly, the above-described bisection method is efficient. However, the bisection method may not be used. For example, it is also possible to calculate the noise amplification factor NA for the "M" coefficients S0 in a round robin method, store the noise amplification factor NA so as to match each coefficient S0, and set the coefficient S0 with which the FA is not saturated and the minimum noise amplification factor NA is obtained, among "M" noise amplification factors, and the noise amplification factor NA as a calculation result.

Figure 22:
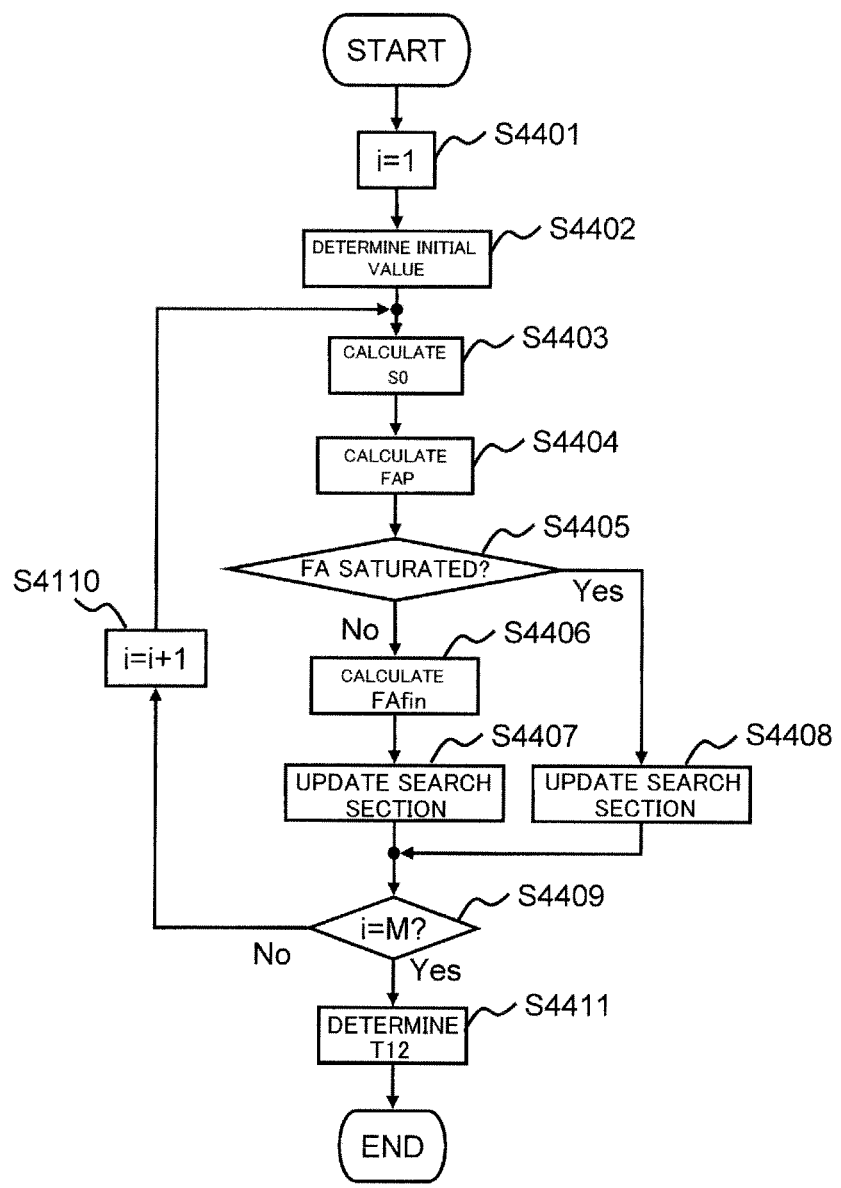
FIG. 22 is a flowchart of a final FA minimization process of the fourth embodiment.

Next, the final FA minimization process in the above step S4205 will be described. In the final FA minimization process, the time constant T12 is changed within the received range, and the time constant T12 when the FAfin is minimized is determined. Some cases were examined, and it could be seen that the FAfin had a single peak for the time constant T12 when the noise amplification factor NA was fixed. Therefore, a process using a golden section method, in which convergence can be simply guaranteed by narrowing the search section with a certain rate, will be described as an example herein. FIG. 22 is a process flow of the final FA minimization process of the present embodiment. In addition, the lower and upper limits of a section (search section) for searching for the time constant T12 when the golden section method is used are assumed to be T12sup and T12inf, respectively.

The signal strength changing pattern determination section 341 initializes the counter i (step S4401), and determines two points (T12A and T12B: (T12A<T128)) within the search section [T12sup,T12inf] as the initial value of T12 (T12A and T12b) in order to narrow the search section (step S4402). Here, since the golden section method is used, points that internally divides the search section [T12sup, T12inf] in a golden section ratio $(1:(1+\sqrt{5})/2, (1+\sqrt{5})/2:1)$ are set as T12A and T12B.

Then, the coefficient S0 (each is assumed to be S0A and S0B) satisfying the conditions, in which the noise amplification factor NA is fixed, when the time constant T12 is set to T12A and T12B is calculated (step S4403). Then, from the signal strength changing pattern SSP when the time constant and the coefficient are set to T12A and S0A and T12B and S0B, the FA changing pattern FAP (FAPA and FAPB) to realize the signal strength changing pattern SSP is calculated using the Prospective EPG (step S4404).

It is determined whether or not both the calculated FA changing patterns (FAPA and FAPB) are saturated (step S4405). If saturation does not occur in both the FA changing patterns (FAPA and FAPB), each FAfin (assumed to be FAfinA and FAfinB) is calculated (step S4406). Then, according to the golden section method, the search section is narrowed according to the magnitude of FAfinA and FAfinB, thereby updating the search section (step S4407). That is, the search section of the time constant T12 is set to [T12sup, T12B] in the case of FAfinA<FAfinB, and is set to [T12A, T12inf] in the case of FAfinA>FAfinB.

However, in order to correspond to the conditions of not being saturated, the golden section method is extended as follows herein.

When saturation has occurred in at least one of the two FA changing patterns (FAPA and FAPB) in step S4405, the search section is narrowed up to the time constant T12 with which the FA changing pattern, in which saturation has occurred, has been calculated, thereby updating the search section (step S4408). That is, the search section is narrowed to the half-open section (T12A, T12inf] if saturation occurs only in the FAPA, and the search section is narrowed to the half-open section [T12sup, T12B) if saturation occurs only in the FAPB. When saturation occurs in both FAPA and FAPB, the search section is narrowed to a search section including T12 (T12max is also included), which has not been saturated in the calculation up to now, of the half-open sections [T12sup, T12B) and (T12A, T12inf]. When both the search sections include T12, any search section may be selected. In the present embodiment, [T12sup, T12B) is assumed to be selected. In addition, upon repetition, T12sup and T12inf are reset as the lower and upper limits of the search section.

The signal strength changing pattern determination section 341 determines whether or not the process has been performed M times after updating the search section (step S4409). When the process has not been performed M times, i is incremented by 1 (step S4410), and the process proceeds to step S4403.

On the other hand, when the process has been performed M times in step S4409, T12, with which the FAfin becomes smallest among the FAfin obtained by T12Sup, T12A, T12B, and T12inf at that point in time, is determined as a calculation result (step S4411), and the process is ended.

In addition, also in the final FA minimization process, it is possible to store FAfin, which is calculated whenever the time constant T12 is updated, so as to match the time constant T12 and set the time constant T12 and the coefficient S0, with which the minimum FAfin of the "M" FAfin is obtained, as a calculation result.

In addition, the number of repetitions is not limited to M times either. For example, whenever the FAfin is calculated, the FAfin may be compared with the previously obtained FAfin. When the value is not changed, the time constant T12 and the coefficient S0 at that point in time may be set as a calculation result.

As described above, according to the present embodiment, the signal strength changing pattern that minimizes the noise amplification factor is determined by changing the parameter of the function showing the signal strength changing pattern, and the FA changing pattern to realize the signal strength changing pattern is calculated. Therefore, as in the first embodiment, since imaging is performed in the FA changing pattern that almost maximizes the SNR in consideration of signal correction, it is possible to obtain an image with a good SNR even if signal correction or the like is performed.

In addition, according to the present embodiment, the signal strength changing pattern that minimizes the noise amplification factor is determined by changing the parameter of the function showing the signal strength changing pattern. Therefore, since the number of variables to be changed is small, it is possible to obtain a result more quickly.

Also in the present embodiment, as in the third embodiment, the function showing the signal strength changing pattern is not limited to Expressions (1) and (2), and Expression (3) may be used.

In addition, regardless of the function used, it is free to search for whichever parameters. For example, Ts can also be used as a search parameter for minimizing the noise amplification factor NA similar to the coefficient S0 and the time constant T12.

In addition, the time constant T12 may not be an object to be searched for. When the fixed time constant T12 is used, the operator may set the time constant T12 using the UI screen 900 similar to other imaging conditions, or the time constant T12 may be stored in advance in the MRI apparatus 100.

Figure 23:
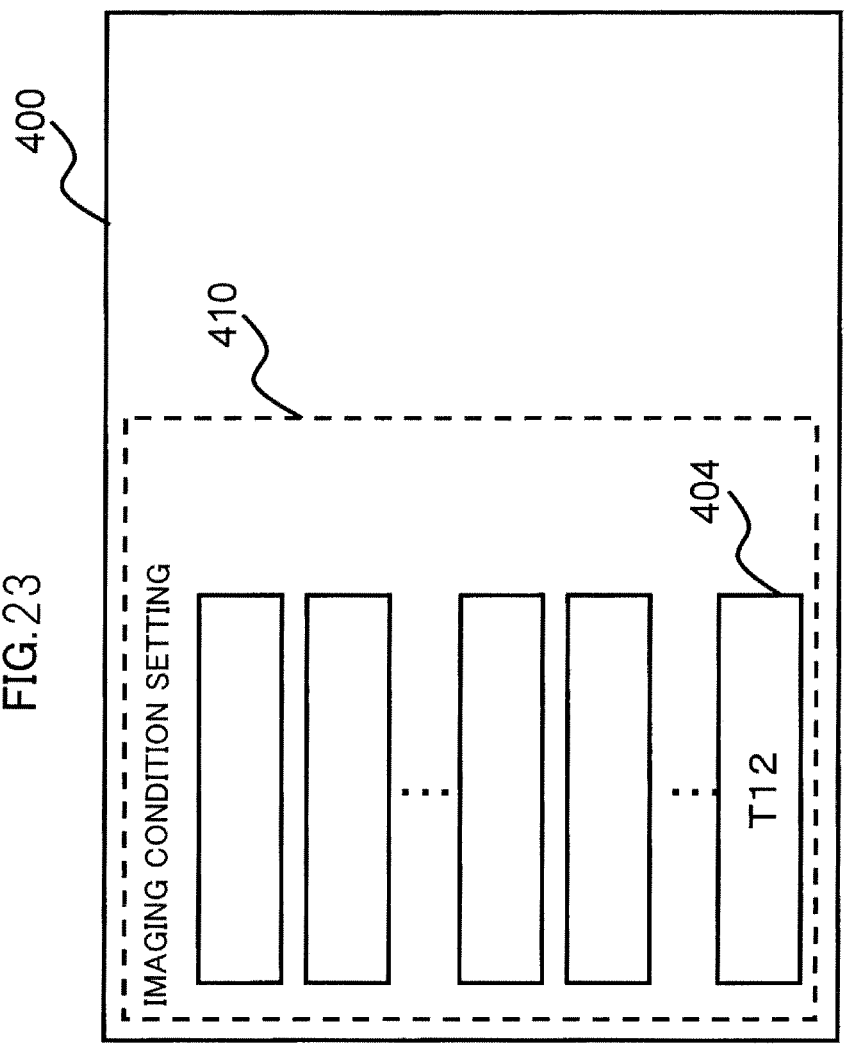
FIG. 23 is an explanatory view for explaining an example of the UI screen of the fourth embodiment.

FIG. 23 shows an example of the setting screen when the operator sets the time constant T12 through the UI screen 900. As shown in this diagram, the UI screen 400 includes a T12 input column 909 in the imaging condition setting region 910.

In addition, when the time constant T12 is not an object to be searched for, the final FA minimization process of the signal strength changing pattern determination process is not performed.

A signal strength changing pattern 541 and an FA changing pattern 542 determined by the method of the present embodiment are shown in FIGS. 24(a) and 24(b), respectively. Here, ETL, IET, T1 of the target, and T2 of the target are set to 80, 0.0073 sec, 1 sec, and 0.1 sec, respectively. In addition, the upper and lower limits of the FA are set to 0° and 180°, respectively. As shown in this diagram, since the process is terminated when the SNR almost becomes a maximum, the FA may not be used up to the upper limit. Here, the above Expression (2) is used as a function showing the signal strength changing pattern.

In addition, also in the present embodiment, it is possible to include an FA modification unit that modifies the FA changing pattern FAP determined by the FA determination section 340, as in the first embodiment. In addition, the FA changing pattern FAP created in advance may be stored in the storage device 72 or the like so that the FA changing pattern FAP is extracted therefrom at the time of imaging.

Figure 25:
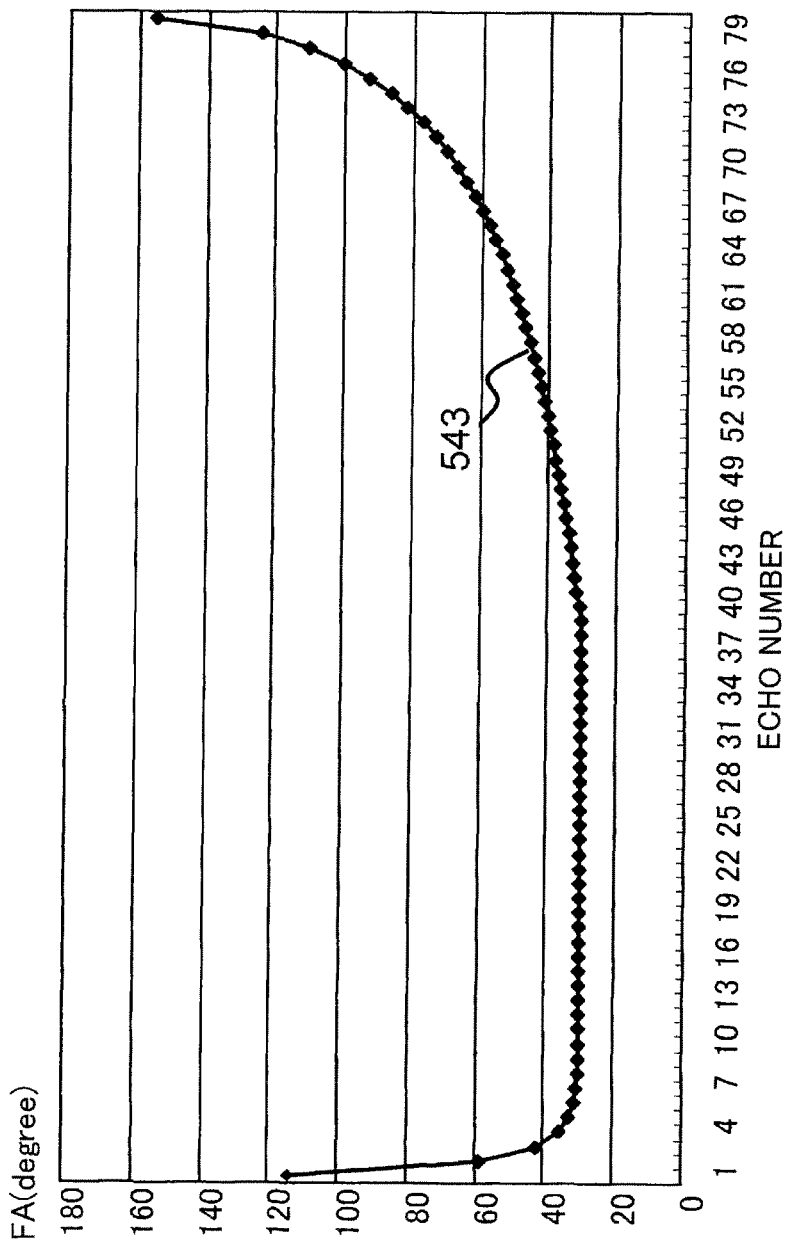
FIG. 25 is a graph of the FA changing pattern after modification of the fourth embodiment.

In addition, when the modification shown in FIG. 9(b) is performed in a state where the lower and upper limits of the FA are set to 30° and 180° while maintaining the conditions of ETL, IET, T1, and T2, the FA changing pattern FAP 542 shown in FIG. 24(b) becomes an FA changing pattern 543 shown in FIG. 25.

In addition, also in the present embodiment, it is possible to set the tissue to be imaged instead of T1 and T2. In addition, when there is a plurality of species of tissues to be imaged, the FA changing pattern may be calculated using the average value of the T1 and T2 values, or it is possible to calculate the FA changing pattern for each of the T1 and T2 values and calculate the average of the FA changing pattern. In addition, T1 and T2 may also be obtained by pre-scan.

According to each embodiment described above, the FA to realize the maximum SNR in the maximum resolution becomes apparent in addition to the effects described above. As a result, considering the trade-offs between the resolution and the SNR becomes easy by modifying the obtained FA.

In addition, although the MRI apparatus 100 includes the sequence creation unit 300 in each embodiment described above, the present invention is not limited thereto. The sequence creation unit 300 may also be built on an information processing apparatus that is provided separately from the MRI apparatus 100 and that can transmit and receive data to and from the MRI apparatus 100.

REFERENCE SIGNS LIST 10 object, 100 MRI apparatus, 20 static magnetic field generation system, 30 gradient magnetic field generation system, 31 gradient magnetic field coil, 32 gradient magnetic field power source, 40 sequencer, 50 transmission system, 51 transmission coil, 52 synthesizer, 53 modulator, 54 high frequency amplifier, 60 receiving system, 61 receiving coil, 62 signal amplifier, 63 quadrature phase detector, 64 A/D converter, 70 signal processing system, 71 CPU, 72 storage device, 73 external storage device, 74 display device, 75 input device, 200 FSE pulse sequence, 201 excitation RF pulse, 202 refocus RE pulse, 203 echo signal, 300 sequence creation unit, 310 FA determination section, 311 FA modification unit, 320 FA determination section, 321 parameter determination section, 322 FA calculation section, 330 FA determination section, 331 signal strength changing pattern determination section, 332 FA calculation section, 340 FA determination section, 341 signal strength changing pattern determination section, 342 FA calculation section, 400 UI screen, 401 T1 input column, 402 T2 input column, 403 target tissue input column, 404 T12 input column, 410 imaging condition setting region, 511 signal strength changing pattern, 512 FA changing pattern, 531 signal strength changing pattern, 532 FA changing pattern, 541 signal strength changing pattern, 542 FA changing pattern, 543 FA changing pattern, 601 FA changing pattern before modification, 603 FA changing pattern after modification, 604 FA changing pattern after modification, 605 FA changing pattern after modification

The invention claimed is:

1. A magnetic resonance imaging apparatus, comprising:
a static magnetic field generation system that generates a static magnetic field;
a gradient magnetic field generation system that applies a gradient magnetic field to an object disposed in the static magnetic field;
a high frequency magnetic field transmission system that transmits a high frequency magnetic field pulse to excite magnetization of the object at a predetermined flip angle;
a signal receiving system that receives an echo signal generated by the object; and
a control system that reconstructs an image from the echo signal received by the signal receiving system and controls operations of the gradient magnetic field generation system, the high frequency magnetic field transmission system, and the signal receiving system according to an imaging sequence, the control system including:
  a receiving unit that receives, from a user, imaging conditions to determine the imaging sequence; and
  a sequence generation unit that generates the imaging sequence according to (a) the imaging conditions received by the receiving unit, and (b) a pulse sequence that includes applying a plurality of refocus high frequency magnetic field pulses after application of one excitation high frequency magnetic field pulse, in which flip angles of the refocus high frequency magnetic field pulses are not constant,
wherein the sequence generation unit determines the flip angles of the respective refocus high frequency magnetic field pulses to maximize an SNR (signal to noise ratio) in a maximum resolution of the reconstructed image by considering contribution of each echo signal to the SNR, said contribution of the echo signal being dependent on amplification of the echo signal caused by a signal correction to suppress image blur as post-processing, and
wherein for each refocus pulse amongst the plurality of refocus high-frequency magnetic field pulses, the flip angle of the refocus pulse is determined so as to minimize a noise amplification factor that reflects not only signal strength of the echo signals arranged in a center of k-space but also signal strength of the echo signals arranged in a region other than the center of k-space and the noise amplification factor is determined based on only the signal strength.

2. A flip angle determination method performed by a magnetic resonance imaging apparatus, the method comprising:
a flip angle determination performed by the magnetic resonance imaging apparatus to determine (i) a plurality of refocus high frequency magnetic field pulses to be applied after an excitation high frequency magnetic field pulse in a multi-echo imaging sequence in the magnetic resonance imaging apparatus, in which angles of the refocus high frequency magnetic field pulses are not constant, and (ii) flip angles of the respective refocus high frequency magnetic field pulses to maximize an SNR (signal to noise ratio) in a maximum resolution of a reconstructed image by considering contribution of each echo signal to the SNR, wherein the contribution is dependent on amplification of the echo signal caused by a signal correction to suppress image blur as post-processing,
wherein for each refocus pulse amongst the plurality of refocus high-frequency magnetic field pulses, the magnetic resonance imaging apparatus determines the flip angle of the refocus pulse so as to minimize a noise amplification factor that reflects not only signal strength of the echo signals arranged in a center of k-space but also signal strength of the echo signals arranged in a region other than the center of k-space and the noise amplification factor is determined by only the signal strength.

3. A method performed by a magnetic resonance imaging apparatus to improve SNR (signal to noise ratio) of a reconstructed image, the magnetic resonance imaging apparatus comprising a static magnetic field generation system to generate a static magnetic field, a gradient magnetic field generation system to apply a gradient magnetic field to an object disposed in the static magnetic field, a high frequency magnetic field transmission system to transmit a high frequency magnetic field pulse to excite magnetization of the object at a predetermined flip angle, and a signal receiving system to receive an echo signal generated by the object, the method comprising:
generating an imaging sequence according to a pulse sequence and imaging conditions set by a user, the pulse sequence including a plurality of refocus high frequency magnetic field pulses to be applied after application of one excitation high frequency magnetic field pulse, in which flip angles of the respective refocus high frequency magnetic field pulses are not constant and are configured to maximize an SNR in a maximum resolution of a reconstructed image by considering contribution of each echo signal to the SNR, said contribution of the echo signal being dependent on amplification of the echo signal caused by a signal correction to suppress image blur as post-processing;
controlling operations of the gradient magnetic field generation system, the high frequency magnetic field transmission system, and the signal receiving system according to the imaging sequence; and
reconstructing an image from the echo signal received by the signal receiving system
wherein for each refocus pulse amongst the plurality of refocus high-frequency magnetic field pulses, the magnetic resonance imaging apparatus determines the flip angle of the refocus pulse so as to minimize a noise amplification factor that reflects not only signal strength of the echo signals arranged in a center of k-space but also signal strength of the echo signals arranged in a region other than the center of k-space and the noise amplification factor is determined by only the signal strength.

4. The magnetic resonance imaging apparatus according to claim 1, wherein
the sequence generation unit includes a flip angle determination section that determines the flip angle of each of the refocus high frequency magnetic field pulses from the imaging conditions, and
the flip angle determination section determines the flip angle by repeatedly calculating an index by changing information specifying the flip angle of each of the refocus high frequency magnetic field pulses according to an optimization method set in advance.

5. The magnetic resonance imaging apparatus according to claim 4, wherein
the flip angle determination section includes a signal strength calculation section that calculates signal strength of each echo signal, which is obtained by application of a refocus high frequency magnetic field pulse corresponding to each information item, from the information specifying the flip angle of each of the refocus high frequency magnetic field pulses, and using the noise amplification factor, which is obtained from a square root of a mean of a square of a reciprocal of the calculated signal strength of each echo signal, as the index, the flip angle of each of the refocus high frequency magnetic field pulses is determined so as to minimize the noise amplification factor.

6. The magnetic resonance imaging apparatus according to claim 4, wherein the information specifying the flip angle of each of the refocus high frequency magnetic field pulses is a flip angle of each of the refocus high frequency magnetic field pulses.

7. The magnetic resonance imaging apparatus according to claim 4, wherein the information specifying the flip angle of each of the refocus high frequency magnetic field pulses is constituted by a number of items, said number of items being smaller than the number of refocus high frequency magnetic field pulses.

8. The magnetic resonance imaging apparatus according to claim 4, wherein the information specifying the flip angle of each of the refocus high frequency magnetic field pulses is a series of intermediate values obtained by thinning out the flip angle of each of the refocus high frequency magnetic field pulses according to a predetermined rule, and the flip angle determination section includes an intermediate value determination section that determines a series of intermediate values, which maximizes the SNR, by changing the series of intermediate values and a flip angle calculation section that calculates the flip angle of each of the refocus high frequency magnetic field pulses by interpolating the determined intermediate value.

9. The magnetic resonance imaging apparatus according to claim 4, wherein the information specifying the flip angle of each of the refocus high frequency magnetic field pulses is a parameter of a function showing a changing pattern in signal strength of an echo signal obtained by application of each of the refocus high frequency magnetic field pulses, the flip angle determination section includes a signal strength changing pattern determination section that determines the parameter to maximize the SNR by changing the parameter and determines a changing pattern in the signal strength and a flip angle calculation section that calculates the flip angle of each of the refocus high frequency magnetic field pulses from the changing pattern in the signal strength specified by the parameter, the function is a function that approaches an exponential function asymptotically, and the parameter is at least one of a coefficient and a time constant of the exponential function.

10. The magnetic resonance imaging apparatus according to claim 4, wherein the information specifying the flip angle of each of the refocus high frequency magnetic field pulses is a parameter of a function showing a changing pattern in signal strength of an echo signal obtained by application of each of the refocus high frequency magnetic field pulses, the flip angle determination section includes a signal strength changing pattern determination section that determines the parameter to maximize the SNR by changing the parameter and determines a changing pattern in the signal strength and a flip angle calculation section that calculates the flip angle of each of the refocus high frequency magnetic field pulses from the changing pattern in the signal strength specified by the parameter, a range for changing the flip angle is set in advance, and the signal strength changing pattern determination section changes the parameter so that the flip angle falls within the range and is not saturated.

11. The magnetic resonance imaging apparatus according to claim 4, wherein the information specifying the flip angle of each of the refocus high frequency magnetic field pulses is a parameter of a function showing a changing pattern in signal strength of an echo signal obtained by application of each of the refocus high frequency magnetic field pulses, the flip angle determination section includes a signal strength changing pattern determination section that determines the parameter to maximize the SNR by changing the parameter and determines a changing pattern in the signal strength and a flip angle calculation section that calculates the flip angle of each of the refocus high frequency magnetic field pulses from the changing pattern in the signal strength specified by the parameter, a range of the flip angle is set in advance, and the flip angle determination section determines the flip angle according to a rule set in advance when the calculated flip angle is not present in the range.

12. The magnetic resonance imaging apparatus according to claim 4, wherein the sequence generation unit further includes a flip angle modification section that modifies the flip angle determined by the flip angle determination section according to a rule set in advance.

13. The magnetic resonance imaging apparatus according to claim 1, further comprising:

a flip angle storage unit that stores a flip angle, which is determined so as to maximize the SNR of the image and which is the flip angle of each of the refocus high frequency magnetic field pulses, for each of the imaging conditions, wherein the sequence generation unit uses a flip angle, which is stored in the flip angle storage unit so as to match the imaging conditions received by the receiving unit, as the flip angle.

14. The magnetic resonance imaging apparatus according claim 1, wherein information specifying longitudinal relaxation time and transverse relaxation time of nuclides to be imaged is included in the imaging conditions.

15. The magnetic resonance imaging apparatus according to claim 1, wherein the sequence generation unit determines the flip angles by changing a flip angle pattern which is a series of flip angle values in a round robin method.

16. The magnetic resonance imaging apparatus according to claim 1, wherein the sequence generation unit determines a signal strength changing pattern that minimizes the noise amplification factor by using a function of the signal strength $SS(tn)$ and determines the flip angles by using the signal strength changing pattern, $$SS(tn)=(1-S0)*\exp(-tn/Ts)+S0*\exp(-tn/T12)$$

wherein tn is time when the n-th echo signal is acquired, S0 is a positive number smaller than 1, Ts=IET/log(2), IET is Inter Echo Time, T12 is a time constant.

17. The magnetic resonance imaging apparatus according to claim 1,
wherein the sequence generation unit calculates a partial derivative of the noise amplification factor with respect to a flip angle pattern which is a series of flip angle values and uses the partial derivative to determine the flip angles.

18. The magnetic resonance imaging apparatus according to claim 1,
wherein the sequence generation unit calculates a partial derivative of the noise amplification factor with respect to a parameter of a function showing a signal strength pattern and uses the partial derivative to determine the flip angles.

19. The magnetic resonance imaging apparatus according to claim 1,
wherein the sequence generation unit determines the flip angles by setting an initial value of the flip angles, calculating the signal strength from the initial value of the flip angles, and repeating the update of value of the flip angles by minimizing the square root of the mean of the square of the reciprocal of the signal strength.

20. The magnetic resonance imaging apparatus according to claim 1,
wherein the sequence generation unit determines the flip angles by setting a function of the signal strength $SS(tn)=(1-S0)*exp(-tn/Ts)+S0*exp(-tn/T12)$, setting an initial value of S0 and T12 in SS(tn), calculating the signal strength from the initial value of S0 and T12, repeating the update of value of S0 and T12 by minimizing the square root of the mean of the square of the reciprocal of the signal strength, and setting the flip angles to 180 degree if the flip angle is saturated,
wherein tn is time when the n-th echo signal is acquired, S0 is a positive number smaller than 1, Ts=IET/log(2), IET is Inter Echo Time, T12 is a time constant.

* * * * *